(12) United States Patent
Kawata et al.

(10) Patent No.: US 10,098,238 B2
(45) Date of Patent: Oct. 9, 2018

(54) METHOD OF MANUFACTURING RESIN MULTILAYER SUBSTRATE

(71) Applicant: Murata Manufacturing Co., Ltd., Kyoto (JP)

(72) Inventors: Masaki Kawata, Kyoto (JP); Yuki Ito, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 234 days.

(21) Appl. No.: 14/886,607

(22) Filed: Oct. 19, 2015

(65) Prior Publication Data

US 2016/0044798 A1   Feb. 11, 2016

Related U.S. Application Data

(63) Continuation of application No. PCT/JP2014/060706, filed on Apr. 15, 2014.

(30) Foreign Application Priority Data

| Jun. 18, 2013 | (JP) | ................................ | 2013-127447 |
| Jul. 10, 2013 | (JP) | ................................ | 2013-144146 |
| Jan. 14, 2014 | (JP) | ................................ | 2014-004357 |

(51) Int. Cl.
*H05K 3/32* (2006.01)
*H05K 1/18* (2006.01)
(Continued)

(52) U.S. Cl.
CPC .............. *H05K 3/32* (2013.01); *H05K 1/185* (2013.01); *H05K 3/0073* (2013.01); *H05K 3/306* (2013.01);
(Continued)

(58) Field of Classification Search
CPC ............ H05K 1/18; H05K 3/30; H05K 1/185; H05K 1/186; H05K 3/0073; H05K 3/306;
(Continued)

(56) References Cited

U.S. PATENT DOCUMENTS 5,108,825 A * 4/1992 Wojnarowski .......... C08L 63/00
257/E23.167
5,157,589 A * 10/1992 Cole, Jr. ................. H01L 23/13
257/700

(Continued)

FOREIGN PATENT DOCUMENTS

| JP | H07-007134 A | 1/1995 |
| JP | 2002-100870 A | 4/2002 |

(Continued)

OTHER PUBLICATIONS

English translation of Written Opinion issued in Application No. PCT/JP2014/060706 dated Jul. 22, 2014.

(Continued)

*Primary Examiner* — Carl Arbes
(74) *Attorney, Agent, or Firm* — Pearne & Gordon LLP

(57) ABSTRACT

A method of manufacturing a resin multilayer substrate is provided in which a component (3) is incorporated in a stacked body obtained by stacking a plurality of thermoplastic resin sheets (2). The method includes the steps of: softening a first resin sheet (2a) by heating, and pressing the component (3) against the first resin sheet (2a), thereby fixing the component (3) to the first resin sheet (2a); stacking the first resin sheet (2a) on a second resin sheet (2b) having a through hole (14) receiving the component (3) and a third resin sheet (2c) located adjacent to a lower side of the component (3) such that the component (3) is inserted into the through hole (14) and the lower surface of the component (3) faces the third resin sheet (2c); and performing (Continued)

compression bonding by heating and pressurizing the stacked body including these resin sheets (2).

10 Claims, 19 Drawing Sheets

(51) Int. Cl.
  *H05K 3/46* (2006.01)
  *H05K 3/30* (2006.01)
  *H05K 3/00* (2006.01)
(52) U.S. Cl.
  CPC ......... *H05K 3/4611* (2013.01); *H05K 3/4644* (2013.01); *H05K 3/4697* (2013.01); *H01L 2224/16225* (2013.01); *H01L 2224/81* (2013.01); *H05K 1/186* (2013.01); *H05K 3/4632* (2013.01); *H05K 2201/0129* (2013.01); *H05K 2203/061* (2013.01); *H05K 2203/063* (2013.01)
(58) Field of Classification Search
  CPC ...... H05K 3/32; H05K 3/4611; H05K 3/4632; H05K 3/4644; H05K 3/4697; H05K 2221/0129; H05K 2203/061; H05K 2203/063; H01L 23/48; H01L 2224/16225; H01L 2224/81
  See application file for complete search history.

(56) References Cited

U.S. PATENT DOCUMENTS

| | | | |
|---|---|---|---|
| 5,161,093 A * | 11/1992 | Gorczyca | H01L 21/4857 257/E23.077 |
| 5,434,751 A * | 7/1995 | Cole, Jr. | H01L 21/485 156/289 |
| 5,497,033 A | 3/1996 | Fillion et al. | |
| 6,271,469 B1 | 8/2001 | Ma et al. | |
| 6,582,991 B1 * | 6/2003 | Maeda | H01L 24/81 257/778 |
| 6,909,054 B2 * | 6/2005 | Sakamoto | H01L 21/4846 174/260 |
| 7,109,063 B2 * | 9/2006 | Jiang | H01L 23/544 257/782 |
| 7,287,321 B2 | 10/2007 | Takeuchi | |
| 7,852,634 B2 * | 12/2010 | Sakamoto | H01L 21/568 361/761 |
| 8,530,753 B2 * | 9/2013 | Kunimoto | H01L 21/568 174/255 |
| 2004/0168825 A1 * | 9/2004 | Sakamoto | H01L 21/4846 174/260 |
| 2007/0209831 A1 * | 9/2007 | Sakamoto | H01L 21/568 174/262 |
| 2008/0295326 A1 | 12/2008 | Tuominen et al. | |
| 2010/0154210 A1 * | 6/2010 | Lee | H01L 23/5389 29/832 |

FOREIGN PATENT DOCUMENTS

| | | |
|---|---|---|
| JP | 2003-017886 A | 1/2003 |
| JP | 2003-198139 A | 7/2003 |
| JP | 2005-223183 A | 8/2005 |
| JP | 2006-073763 A | 3/2006 |
| JP | 2008-509549 A | 3/2008 |
| JP | 2008-141007 A | 6/2008 |
| JP | 2008-159658 A | 7/2008 |
| JP | 2009-027125 A | 2/2009 |
| JP | 2012-074497 A | 4/2012 |

OTHER PUBLICATIONS

English translation of International Search Report issued in Application No. PCT/JP2014/060706 dated Jul. 22, 2014.
Office action issued in JP2015-522619 dated Jul. 12, 2016.

\* cited by examiner

METHOD OF MANUFACTURING RESIN MULTILAYER SUBSTRATE

TECHNICAL FIELD

The present disclosure relates to a method of manufacturing a resin multilayer substrate incorporating a component.

BACKGROUND ART

When a component is incorporated in a resin multilayer substrate, it is general to use a method comprising: mounting a component on the surface of a resin sheet of a plurality of stacked resin sheets; stacking one or more resin sheets each provided with a through hole in which the component is received; and further stacking an upper resin sheet so as to cover the component disposed within the through hole.

Also, there is a proposed method comprising: forming a cavity by creating a through hole in each of some resin sheets of a plurality of stacked resin sheets; inserting, into the cavity, a corresponding one of components separately held by a known technique such as vacuum suction; and further stacking an upper resin sheet so as to cover the component received in the cavity. In this case, if the cavity is equal in size to the component as seen in plan view, the component cannot be fitted in the cavity when the position of the component is only slightly displaced. Accordingly, in order to avoid such a situation, the cavity is formed to have a size larger than the size of the component. Therefore, in the state where the component is placed in the cavity, a gap is produced between the outer circumferential side surface of the component and the inner circumferential side surface of the cavity.

For example, Japanese Patent Laying-Open No. 2008-141007 (PTD 1) discloses a method of manufacturing a multilayer substrate in which an electronic component is embedded in a stack of a plurality of resin films each made of a thermoplastic resin. According to PTD 1, some of the resin films each are provided with a through hole through which an electronic component is inserted. This through hole is formed larger than the outer shape of the electronic component in order to allow easy insertion of the electronic component. PTD 1 discloses that the gap between the outer circumferential side surface of the component and the inner wall of the through hole is filled by a resin flowing thereinto during the process of heating and pressurizing a stacked body.

In the case where such a gap is provided, positioning of the component within the cavity causes a problem. In order to deal with this problem, Japanese Patent Laying-Open No. 2006-73763 (PTD 2) discloses a configuration in which a protrusion is provided in an inner wall of a through hole in order to suppress the positional displacement of a chip component in a manufacturing stage. When a chip component is placed within a cavity, the component is to be press-fitted while it crushes the tip end of each protrusion. In this way, the chip component is supported by this protrusion from the side and thereby positioned within the cavity.

CITATION LIST

Patent Document

PTD 1: Japanese Patent Laying-Open No. 2008-141007
PTD 2: Japanese Patent Laying-Open No. 2006-73763

SUMMARY

In order to hold components separately by a certain apparatus and insert each component into a corresponding one cavity, a gap between the outer circumferential side surface of each component and the inner circumferential side surface of each cavity needs to be relatively large. However, in the case where this gap is relatively large, the region filled up by the flow of resin during thermocompression bonding becomes correspondingly large. Accordingly, the influence of the flow of resin is more likely to be exerted, which poses a problem wherein a component is displaced by pressing from the flow of resin. Furthermore, in the case where the region filled up by the flow of resin is relatively large, the smoothness of the entire stacked body (e.g., undulations and the like on the surface of the stacked body and the like) becomes a problem. Higher smoothness means fewer undulations and the like on the surface. In the case of a stacked body with low smoothness, a mounting component and the like are difficult to be mounted on its surface.

From the reasons described above, it is desirable that the smallest possible size of a gap is provided between the outer circumferential side surface of each component and the inner circumferential side surface of each cavity. However, in the case where a protrusion is provided as in PTD 2, the gap has to be increased in size to some extent. As a result, a sufficiently small gap cannot be provided.

Accordingly, the present disclosure provides a method of manufacturing a resin multilayer substrate incorporating a component, by which a gap between the outer circumferential side surface of a component and the inner circumferential side surface of a cavity can be further reduced in size.

A method of manufacturing a resin multilayer substrate is provided in which a component is incorporated in a stacked body obtained by stacking a plurality of thermoplastic resin sheets. The method includes the steps of: fixing the component to a first resin sheet of the plurality of resin sheets by pressing the component against the first resin sheet in a state where the first resin sheet is softened by heating, the first resin sheet being located adjacent to a first side in a thickness direction of the component; stacking the first resin sheet having the component fixed thereto on a second resin sheet of the plurality of resin sheets that has a through hole receiving the component and a third resin sheet of the plurality of resin sheets that is located adjacent to a second side of the component opposite to the first side, such that the component is inserted into the through hole and a surface of the component on the second side faces the third resin sheet; and performing compression bonding by heating and pressurizing the stacked body including the first resin sheet, the second resin sheet and the third resin sheet.

According to the present disclosure, a component, which is first fixed to the surface of the first resin sheet, can be accurately positioned when it is fixed to the surface of the first resin sheet. Furthermore, even if the component may collide with the second resin sheet around the periphery of the cavity, it becomes possible to avoid such a phenomenon wherein the component is popped out. Accordingly, a gap between the outer circumferential side surface of the component and the inner circumferential side surface of the cavity can be further reduced in size.

DETAILED DESCRIPTION (First Embodiment)

Figure 1:
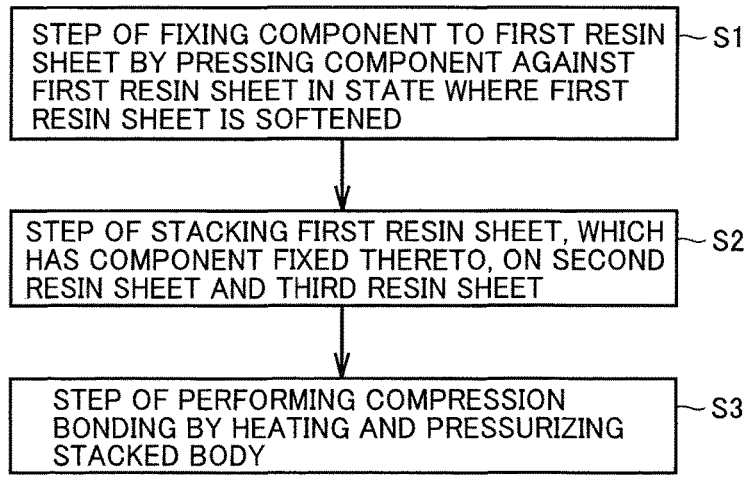
FIG. 1 is a flowchart of a method of manufacturing a resin multilayer substrate in a first embodiment according to the present disclosure.

Referring to FIGS. 1 to 5, a method of manufacturing a resin multilayer substrate in a first embodiment according to the present disclosure will be hereinafter described. FIG. 1 shows a flowchart of the method of manufacturing a resin multilayer substrate in the present embodiment.

The method of manufacturing a resin multilayer substrate in the present embodiment is a method wherein a component is incorporated in a stacked body obtained by stacking a plurality of thermoplastic resin sheets. The method includes: step S1 of fixing the component to a first resin sheet of the plurality of resin sheets by pressing the component against the first resin sheet in a state where the first resin sheet is softened by heating, the first resin sheet being located adjacent to a first side in a thickness direction of the component; step S2 of stacking the first resin sheet having the component fixed thereto on a second resin sheet of the plurality of resin sheets that has a through hole receiving the component and a third resin sheet of the plurality of resin sheets that is located adjacent to a second side of the component opposite to the first side, such that the component is inserted into the through hole and a surface of the component on the second side faces the third resin sheet; and step S3 of performing compression bonding by heating and pressurizing the stacked body including the first resin sheet, the second resin sheet and third resin sheet.

Each step included in the method of manufacturing a resin multilayer substrate in the present embodiment will be hereinafter described in detail.

Figure 2:
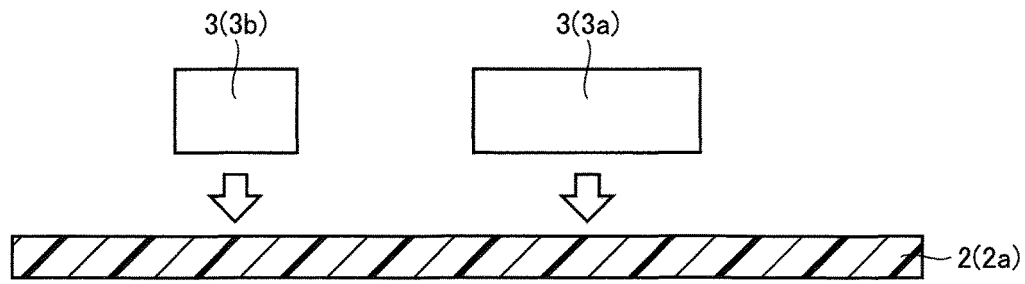
FIG. 2 is a first explanatory diagram of the method of manufacturing a resin multilayer substrate in the first embodiment according to the present disclosure.

First, in step S1, as shown in FIG. 2, one or more components 3 are pressed against first resin sheet 2a of a plurality of resin sheets 2 in the state where the first resin sheet 2a is softened by heating, thereby fixing component(s) 3 to first resin sheet 2a. The first resin sheet 2a is located adjacent to the first side in the thickness direction of the component(s) 3 (for example, the upper side in FIG. 5).

The number of components 3 may be one or may be two or more. When there are a plurality of components 3, these components 3 may have the same size or may have different sizes. FIG. 2 shows an example in which one component 3a and one component 3b that have different sizes are included as components 3. It is to be noted that all of components 3 have the same thickness in this example. In this case, only two components 3 are included, which is however for convenience of illustration. In practice, the number of components 3 may be three or more.

When performing step S1, component 3 can be held by a known technique such as vacuum suction. For example, component 3 can be positioned relative to first resin sheet 2a and pressed against thereto in the state where component 3 is held by vacuum suction.

The plurality of resin sheets 2 can be made of any material made of a thermoplastic resin. A thermoplastic resin can include, for example, LCP (liquid crystal polymer), PEEK (polyetheretherketone), PEI (polyether imide), PPS (polyphenylene sulfide), thermoplastic PI (polyimide), and/or other like materials.

Figure 3:
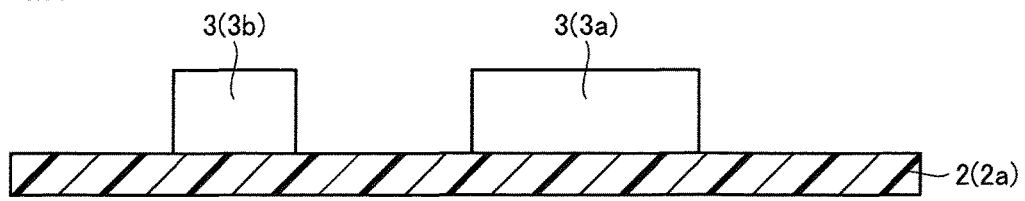
FIG. 3 is a second explanatory diagram of the method of manufacturing a resin multilayer substrate in the first embodiment according to the present disclosure.

Since the first resin sheet 2a of the plurality of resin sheets 2 is a sheet made of a thermoplastic resin, it can be softened by heating. By pressing component 3 against this softened first resin sheet 2a, component 3 adheres to first resin sheet 2a and is brought into the fixed state, as shown in FIG. 3. In this case, a part of first resin sheet 2a to which component 3 is fixed may be locally recessed. First resin sheet 2a may have one surface on which a conductor pattern is formed that does not cover at least a part of first resin sheet 2a against which component 3 is pressed. Component 3 can be pressed directly against the surface of the softened thermoplastic resin, and thereby, fixed. A via conductor may be formed within first resin sheet 2a.

Figure 4:
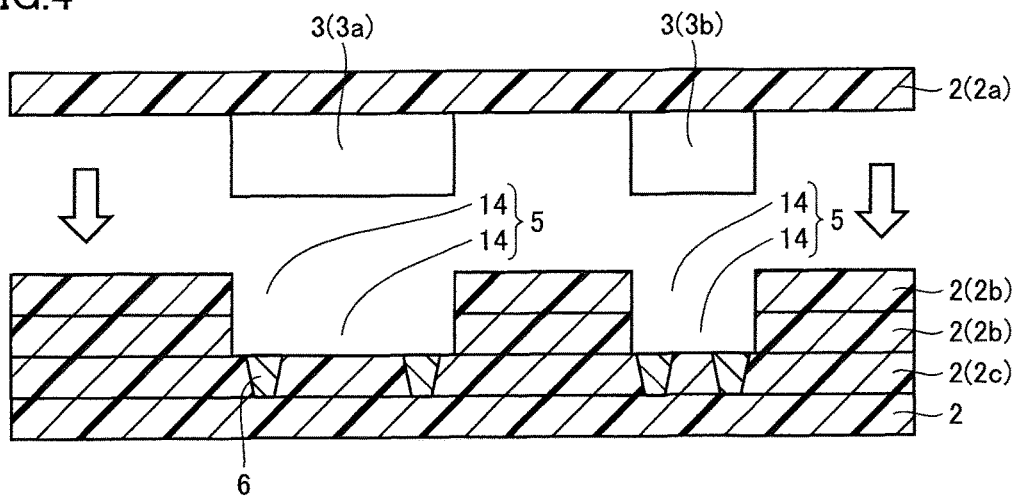
FIG. 4 is a third explanatory diagram of the method of manufacturing a resin multilayer substrate in the first embodiment according to the present disclosure.

Then, in step S2, as shown in FIG. 4, first resin sheet 2a having components 3 fixed thereto is stacked on a second resin sheet 2b of the plurality of resin sheets 2 that has a through hole 14 receiving component 3 and a third resin sheet 2c of the plurality of resin sheets 2 that is to be located adjacent to the second side of component 3 opposite to the first side. Step S2 is performed such that component 3 is inserted into through hole 14 and the surface of component 3 on the second side faces third resin sheet 2c. In the example shown in FIG. 4, the first side corresponds to the upper side of a finished product (see FIG. 5) and the second side corresponds to the lower side of the finished product. As shown in FIG. 4, second resin sheet 2b may be two or more sheets wherein a plurality of through holes 14 in the two or more sheets are connected, thereby providing a cavity 5. When there is only one second resin sheet 2b, through hole 14 of the one sheet serves as cavity 5.

In the example shown in FIG. 4, via conductor 6 is disposed within third resin sheet 2c in a portion corresponding to the bottom surface of cavity 5. Each via conductor 6 serves to establish an electrical connection to component 3. To be precise, at this point of time, each via conductor 6 can be an un-hardened conductive paste, containing Sn, Ag and the like as constituents, that is turned into a metal solid by the heating and pressurizing process in the subsequent step S3. In addition, in the case where an electrical connection is established between component 3 and via conductor 6, it is preferable that an intermetallic compound is formed by the heating and pressurizing process in step S3 in the vicinity of the interface at which component 3 and via conductor 6 come in contact with each other. Thereby, the electrical connection between component 3 and via conductor 6 can be stabilized.

For convenience of illustration, only via conductor 6 within third resin sheet 2c corresponding to the bottom surface of cavity 5 is shown as a via conductor, but via conductors may be provided in other portions within this stacked body. Furthermore, although the conductor pattern within the stacked body is not shown for convenience of illustration, a conductor pattern may be in practice disposed on the upper surface or the lower surface of each resin sheet 2. The same also applies to other embodiments described below.

In the example shown in FIG. 4, the surface of component 3 on the second side is electrically connected to via conductor 6 and the surface of component 3 on the second side comes into contact with third resin sheet 2c. However, an electrical connection from the second side to component 3 through via conductor 6 is not necessary. Depending on the way of establishing an electrical connection to component 3, it is not necessary that the surface of component 3 on the second side is in contact with third resin sheet 2c. Rather, the surface of component 3 on the second side may only face third resin sheet 2c without contacting the third resin sheet 2c.

In the case where incorporated component 3 does not particularly require an electrical connection, via conductor 6 does not necessarily have to be disposed within third resin sheet 2c.

In FIG. 4, a plurality of second resin sheets 2b and third resin sheet 2c are temporarily compression bonded in advance. Resin sheet 2 located below third resin sheet 2c is also temporarily compression bonded at the same time. Generally, temporary compression bonding is performed at a temperature lower than that in the main compression bonding. A partial stacked body obtained by performing temporary compression bonding is configured in the state where cavity 5 is opened in its upper surface. In step S2, first resin sheet 2a is stacked from above on such a partial stacked body.

Figure 5:
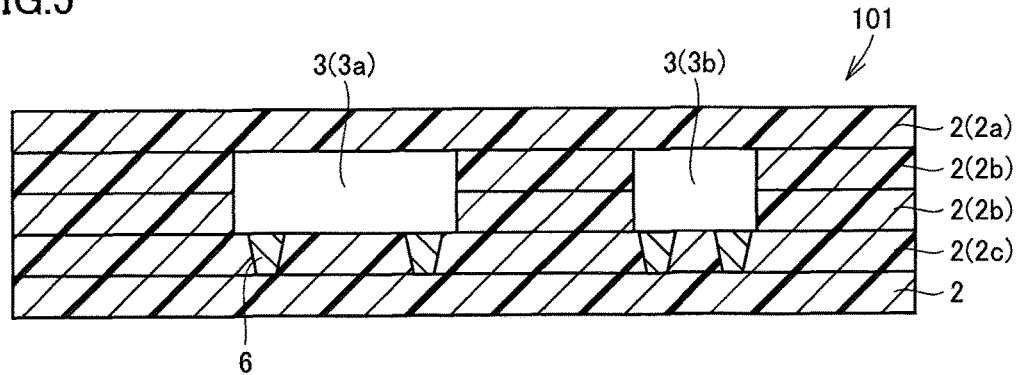
FIG. 5 is a cross-sectional view of the resin multilayer substrate obtained by the method of manufacturing a resin multilayer substrate in the first embodiment according to the present disclosure.

Then, in step S3, compression bonding is performed by heating and pressurizing a stacked body including first resin sheet 2a, second resin sheet 2b, and third resin sheet 2c. In this way, a resin multilayer substrate 101 as shown in FIG. 5 can be obtained.

In the present embodiment, component 3 inserted into cavity 5 is already fixed to the surface of first resin sheet 2a prior to step S2. Component 3 can be accurately positioned when it is fixed to the surface of first resin sheet 2a. This eliminates the need to provide a protrusion used for positioning component 3 on the inner wall of cavity 5.

Even if the accuracy of alignment of component 3 with cavity 5 as seen in plan view is poor to some extent and the size of cavity 5 is not sufficient for the size of component 3 such that component 3 collides with second resin sheet 2b in the vicinity of cavity 5, component 3 will be pressed by first resin sheet 2a and pushed into cavity 5 since component 3 is widely covered by first resin sheet 2a. Since component 3 is pushed into the cavity in the state where it is confined below first resin sheet 2a, it becomes possible to avoid such a phenomenon wherein the component 3 is popped out (a phenomenon conventionally regarded as a problem). Therefore, cavity 5 does not have to be formed in a size significantly larger than that of component 3, but can be formed in a size similar to that of component 3.

From the reason as described above, in the present embodiment, the gap between the outer circumferential side surface of the component and the inner circumferential side surface of the cavity can be further reduced in size.

Figure 6:
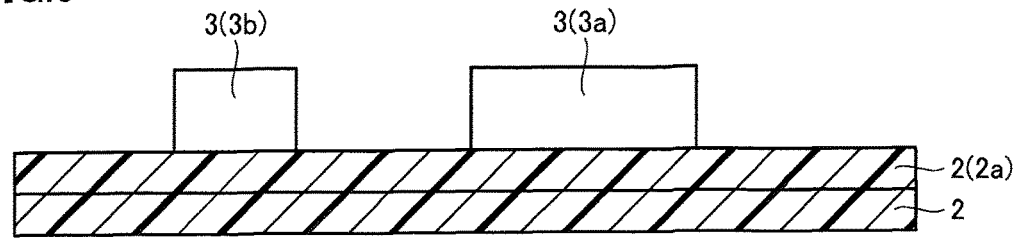
FIG. 6 is a first explanatory diagram of a modification of the method of manufacturing a resin multilayer substrate in the first embodiment according to the present disclosure.

In addition, although FIGS. 2 to 4 each show that first resin sheet 2a is independently provided and has component 3 fixed thereto, the present disclosure is not limited to such an embodiment. Temporary compression bonding may be performed in advance in the state where one resin sheet or two or more resin sheets is or are combined with first resin sheet 2a. Alternatively, component 3 may be fixed to a product obtained by temporary compression bonding in this way, which is as shown in FIG. 6, for example. In this example, in step S1, component 3 is fixed to a product obtained by temporarily compression bonding a stack of another resin sheet 2 overlaid on first resin sheet 2a. During fixation, at least the surface of first resin sheet 2a only has to be softened.

Figure 7:
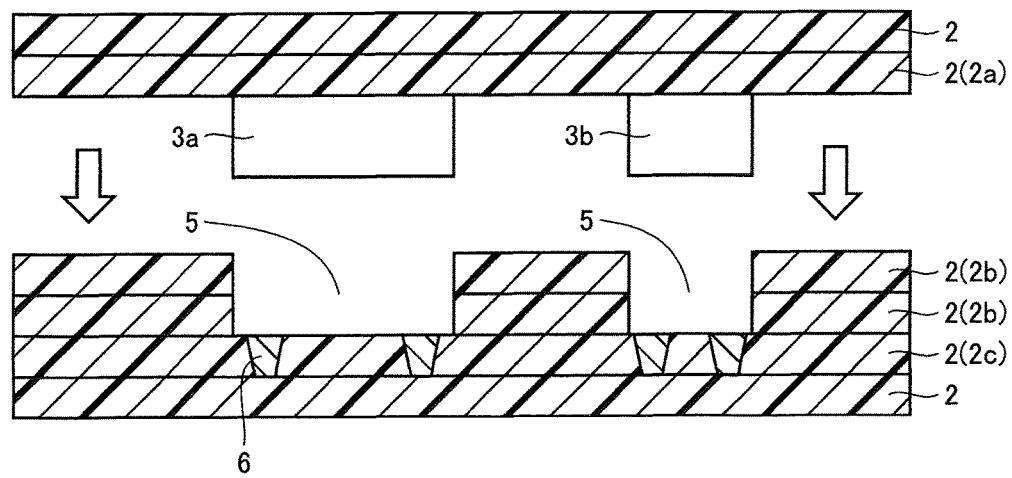
FIG. 7 is a second explanatory diagram of the modification of the method of manufacturing a resin multilayer substrate in the first embodiment according to the present disclosure.
Figure 8:
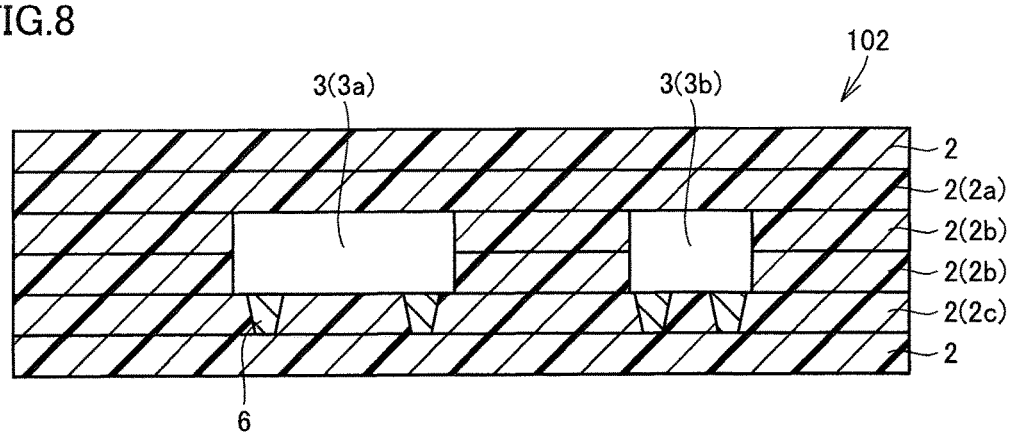
FIG. 8 is a cross-sectional view of the resin multilayer substrate obtained by the modification of the method of manufacturing a resin multilayer substrate in the first embodiment according to the present disclosure.

In this case, in step S2, partial stacked bodies each having been temporary compression bonded are to be combined with each other, as shown in FIG. 7. Then, step S3 of compression bonding is performed, so that a resin multilayer substrate 102 (as shown in FIG. 8) can be obtained.

Figure 9:
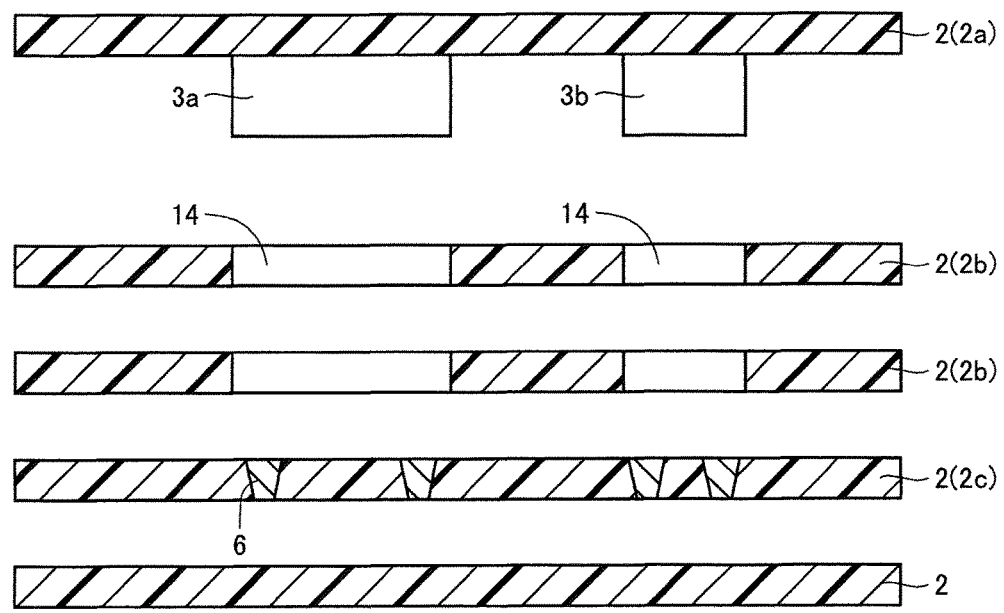
FIG. 9 is an explanatory diagram of a further modification of the method of manufacturing a resin multilayer substrate in the first embodiment according to the present disclosure.

Furthermore, in the example shown in FIG. 4, step S2 is performed using a plurality of second resin sheets 2b s and one third resin sheet 2c that have been temporary compression bonded in advance. Step S2 may however be performed by stacking separate resin sheets as shown in FIG. 9. Since this can eliminate the need to mount a component on the substrate having a cavity, a partial stacked body does not have to be temporarily compression bonded for preparation in advance. Therefore, a group of separate resin sheets can be collectively stacked, thereby improving the efficiency.

(Second Embodiment)

Although the first embodiment has been described wherein a plurality of components 3 have the same height, the present disclosure can be applicable also to the case where components having different heights are mixedly used. The method of manufacturing a resin multilayer substrate mixedly incorporating components having different heights will be described in the second embodiment.

Figure 10:
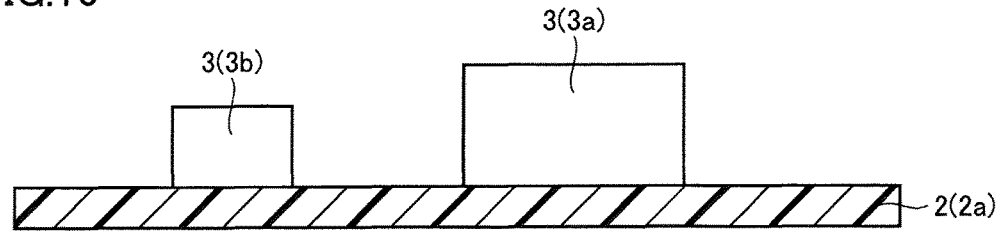
FIG. 10 is a first explanatory diagram of a method of manufacturing a resin multilayer substrate in a second embodiment according to the present disclosure.
Figure 11:
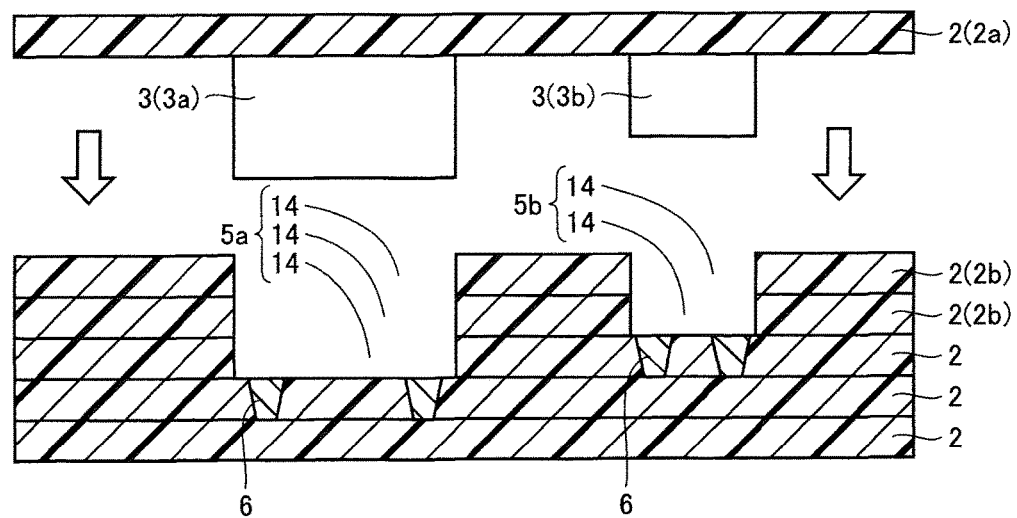
FIG. 11 is a second explanatory diagram of the method of manufacturing a resin multilayer substrate in the second embodiment according to the present disclosure.
Figure 12:
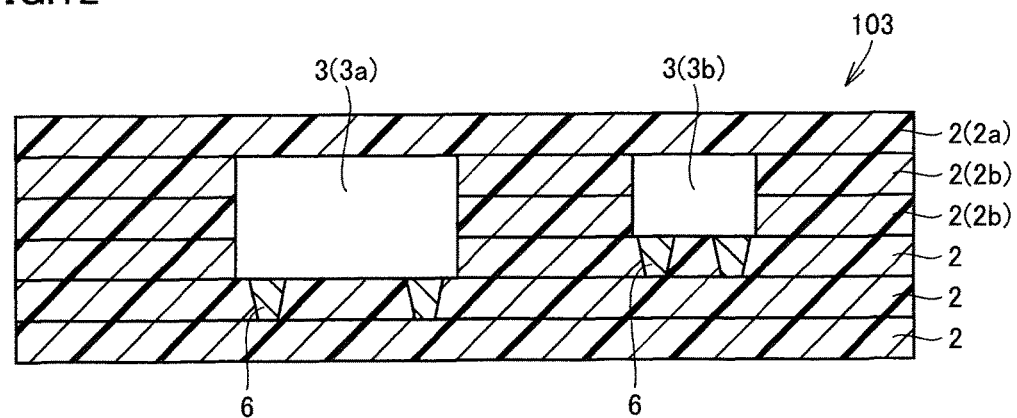
FIG. 12 is a cross-sectional view of a resin multilayer substrate obtained by the method of manufacturing a resin multilayer substrate in the second embodiment according to the present disclosure.

Referring to FIGS. 10 to 12, the method of manufacturing a resin multilayer substrate in the second embodiment according to the present disclosure will be hereinafter described.

In the example shown in FIG. 10, component 3a and component 3b having different heights exist as components 3. Step S1 is performed in the same manner as having been described in the first embodiment, to fix component 3a and component 3b to the upper surface of the same first resin sheet 2a. Component 3a is higher than component 3b.

As shown in FIG. 11, step S2 is performed. Although the details of step S2 are the same as those having been described in the first embodiment, cavities 5a and 5b having different depths are prepared in the lower partial stacked body. Cavity 5a for component 3a is provided by a connection of through holes 14 of three layers. Cavity 5b for component 3b is provided by a connection of through holes 14 of two layers. In this way, the number of resin sheets each provided with through hole 14 only has to be adjusted as appropriate such that a cavity having a depth corresponding to a height of each component 3 is formed. Step S3 is performed after the resin sheets are stacked in step S2 as shown in FIG. 11. In this way, a resin multilayer substrate 103 as shown in FIG. 12 can be obtained.

The same effects as those having been described in the first embodiment can be obtained also in the present embodiment.

Figure 13:
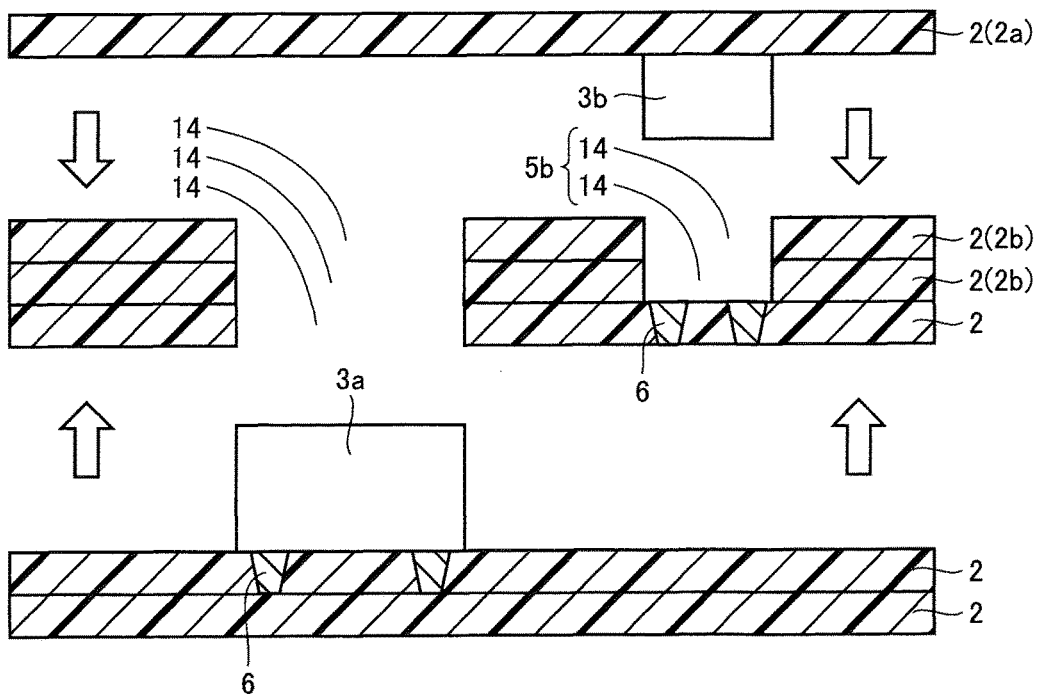
FIG. 13 is an explanatory diagram of a modification of the method of manufacturing a resin multilayer substrate in the second embodiment according to the present disclosure.

In addition, in order to achieve resin multilayer substrate 103 shown in FIG. 12, all of the plurality of components 3 that should be incorporated may be fixed to first resin sheet 2a, as shown in FIGS. 10 to 11, or may be configured as shown in FIG. 13, for example. As shown in FIG. 13, some of the plurality of components 3 that should be incorporated may be fixed to upper first resin sheet while others of the plurality of components 3 are fixed to the upper surface of the lower partial stacked body. In this state, step S2 is performed. Component 3a is inserted into a continuation of through holes 14 of three layers from below as seen in the figure. Component 3b is inserted from above into cavity 5b formed of a continuation of through holes 14 of two layers.

Figure 14:
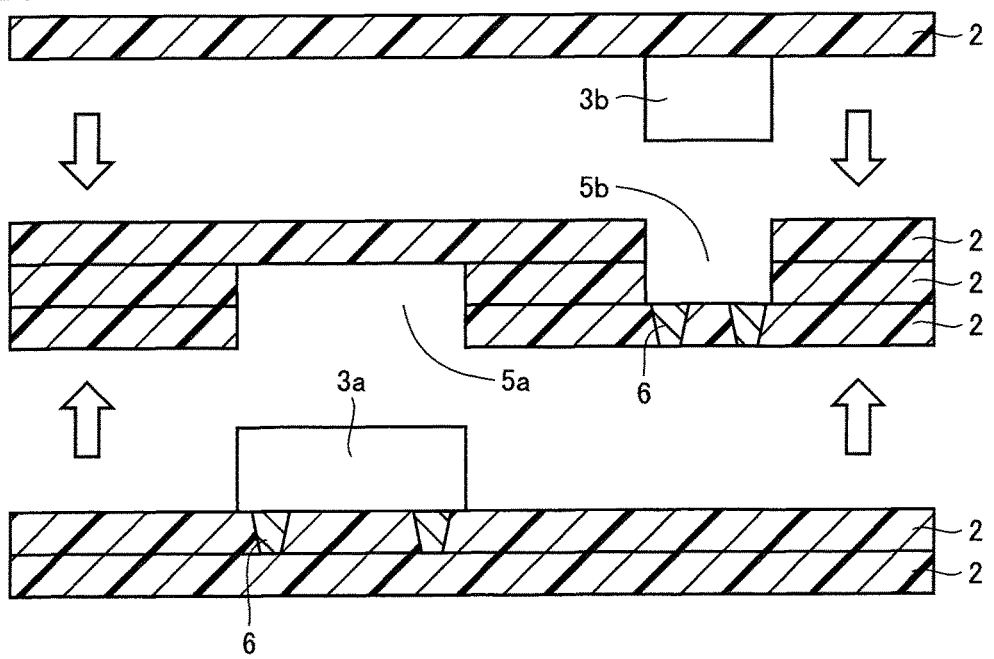
FIG. 14 is an explanatory diagram of a further modification of the method of manufacturing a resin multilayer substrate in the second embodiment according to the present disclosure.
Figure 15:
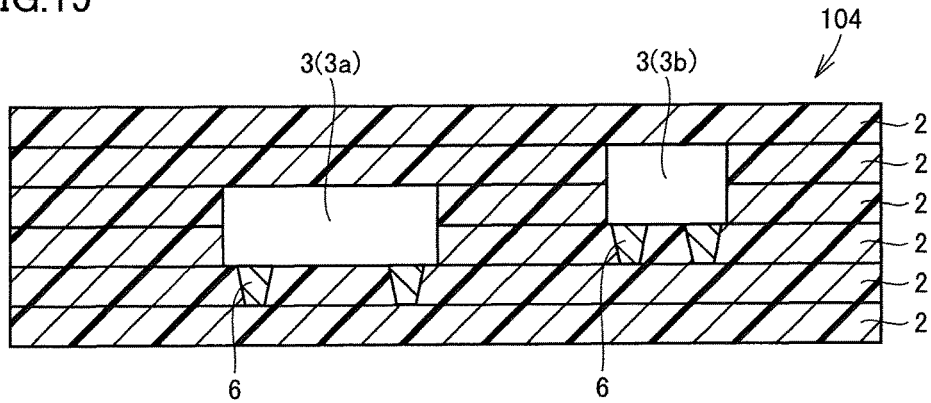
FIG. 15 is a cross-sectional view of the resin multilayer substrate obtained by the further modification of the method of manufacturing a resin multilayer substrate in the second embodiment according to the present disclosure.

Although the upper surfaces of component 3a and component 3b coincidentally lie in the same plane in the example shown in FIG. 13, the present disclosure can be applicable also to the case other than this. For example, there is a case where a plurality of components 3 are provided and the upper surfaces and the lower surfaces of components 3 are located at different positions, which can be dealt with by performing step S2 as shown in FIG. 14. In the example shown in FIG. 14, the upper surfaces of component 3a and component 3b are located at different positions. The stacked body of the intermediate portion is provided with a cavity 5a that is opened downward and a cavity 5b that is opened upward. Component 3a is inserted into cavity 5a from below as seen in the figure while component 3b is inserted into cavity 5b from above as seen in the figure. In this way, a resin multilayer substrate 104 as shown in FIG. 15 can be obtained.

(Third Embodiment)

Figure 16:
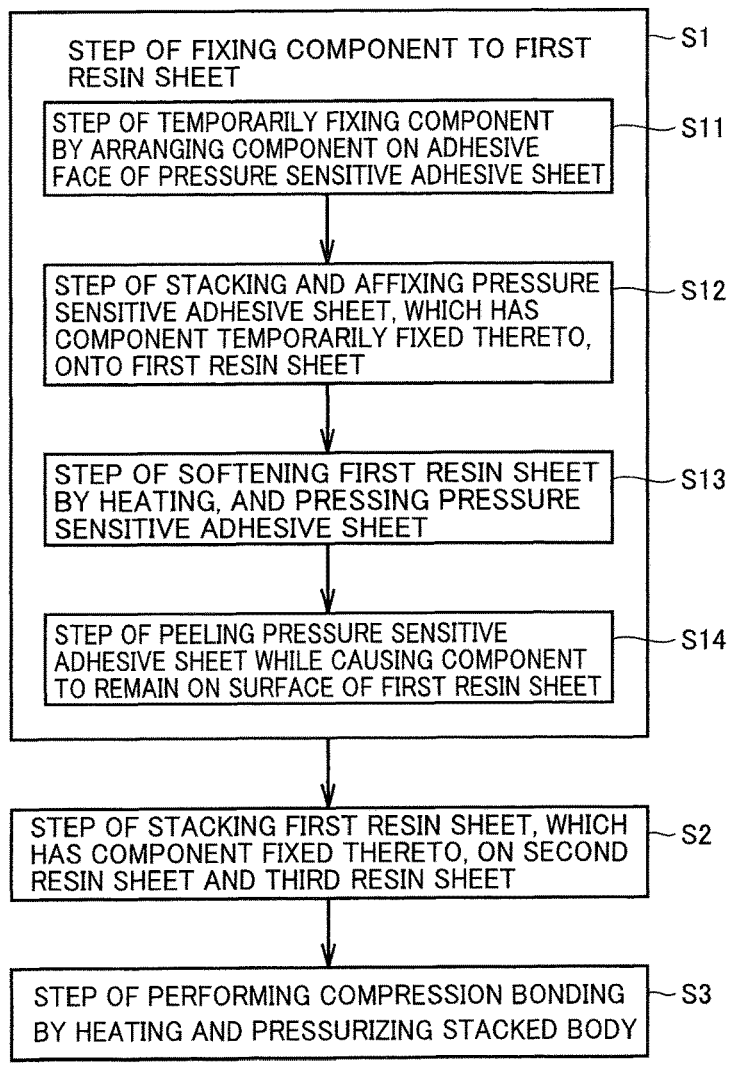
FIG. 16 is a flowchart of a method of manufacturing a resin multilayer substrate in a third embodiment according to the present disclosure.

Referring to FIGS. 16 to 20, a method of manufacturing a resin multilayer substrate in a third embodiment according to the present disclosure will be hereinafter described. The flowchart of the method of manufacturing a resin multilayer substrate in the present embodiment is shown in FIG. 16.

The method of manufacturing a resin multilayer substrate in the present embodiment is basically the same as those in the first and second embodiments, but different in the following points.

In the method of manufacturing a resin multilayer substrate in the present embodiment, step S1 of fixing the component to the first resin sheet includes: step S11 of temporarily fixing the component by arranging the component on an adhesive face provided on the surface of a pressure sensitive adhesive sheet; step S12 of stacking the pressure sensitive adhesive sheet, which has the component temporarily fixed thereto, on the first resin sheet in such a manner that the component is in contact with the first resin sheet; step S13 of softening the first resin sheet by heating, and pressing the pressure sensitive adhesive sheet against the first resin sheet; and step S14 of peeling the pressure sensitive adhesive sheet while causing the component to remain on the surface of the first resin sheet.

Each of the steps included in the method of manufacturing a resin multilayer substrate in the present embodiment will be hereinafter described in detail. According to this manufacturing method, step S1 is specifically as described below.

Figure 17:
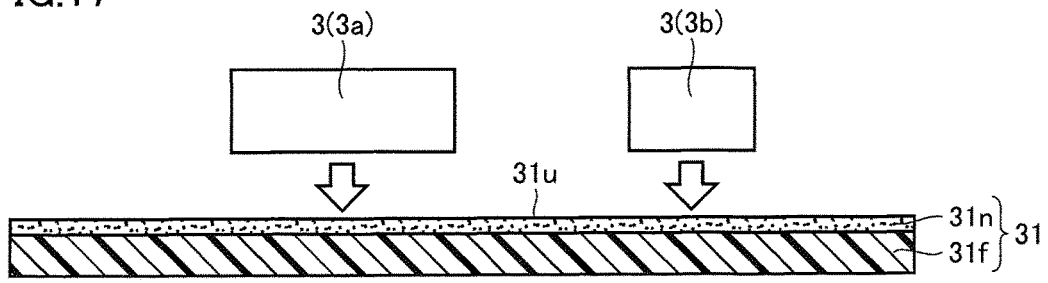
FIG. 17 is a first explanatory diagram of the method of manufacturing a resin multilayer substrate in the third embodiment according to the present disclosure.

First, in step S11, as shown in FIG. 17, component 3 is temporarily fixed to a pressure sensitive adhesive sheet 31 by arranging component 3 on an adhesive face 31u provided on the surface of the pressure sensitive adhesive sheet 31. Pressure sensitive adhesive sheet 31 includes a resin layer 31f and an adhesive layer 31n. The upper surface of adhesive layer 31n corresponds to adhesive face 31u. Resin layer 31f is a film that may be made of PET (polyethylene terephthalate), PEN (polyethylene naphthalate), polyester, PPS (polyphenylene sulfide), and/or other like materials. Adhesive layer 31n is a layer of an acrylic-based adhesive, for example. In place of an acrylic-based adhesive, adhesive layer 31n may be a silicone-based adhesive. Adhesive layer 31n may exhibit poor adhesiveness.

Figure 18:
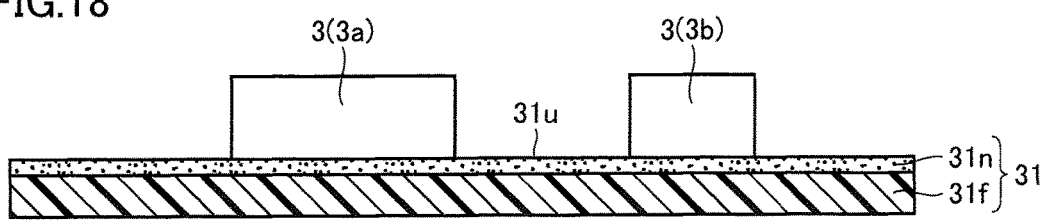
FIG. 18 is a second explanatory diagram of the method of manufacturing a resin multilayer substrate in the third embodiment according to the present disclosure.

FIG. 18 shows the state where component 3 is temporarily fixed to pressure sensitive adhesive sheet 31.

Figure 19:
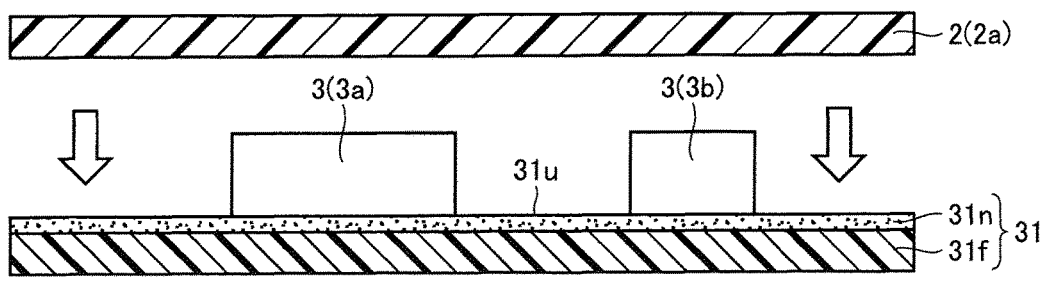
FIG. 19 is a third explanatory diagram of the method of manufacturing a resin multilayer substrate in the third embodiment according to the present disclosure.

Then, in step S12, as shown in FIG. 19, in the state where first resin sheet 2a is softened by heating, pressure sensitive adhesive sheet 31 having component 3 temporarily fixed thereto is stacked on first resin sheet 2a in such a manner that component 3 is in contact with first resin sheet 2a. FIG. 19 shows the state where first resin sheet 2a is stacked from above without moving pressure sensitive adhesive sheet 31 having the upper surface on which component 3 is temporarily fixed. Such a method may be employed. In contrast, first resin sheet 2a is placed, on which pressure sensitive adhesive sheet 31 having component 3 temporarily fixed thereto may be stacked upside down from above.

Figure 20:
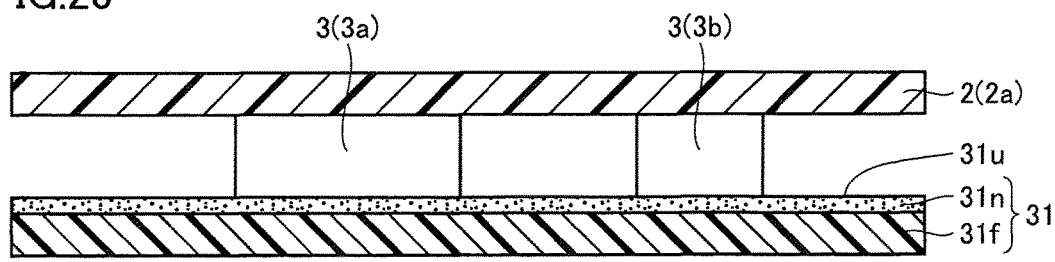
FIG. 20 is a fourth explanatory diagram of the method of manufacturing a resin multilayer substrate in the third embodiment according to the present disclosure.

Pressure sensitive adhesive sheet 31 and first resin sheet 2a are stacked and affixed to each other as shown in FIG. 19, which results in the state as shown in FIG. 20.

Then, in step S13, first resin sheet 2a is softened by heating, and pressure sensitive adhesive sheet 31 is pressed against first resin sheet 2a. When first resin sheet 2a is heated, pressure sensitive adhesive sheet 31 may also be heated together. Component 3 adheres to first resin sheet 2a in the softened state. The adhesive strength of softened first resin sheet 2a to component 3 is higher than the adhesive strength of adhesive face 31u of pressure sensitive adhesive sheet 31 to component 3.

Then, in step S14, pressure sensitive adhesive sheet 31 is peeled off while causing component 3 to remain on the surface of first resin sheet 2a, which results in the state as shown in FIG. 3 wherein the component 3 is fixed to the surface of first resin sheet 2a.

Since the adhesive strength of softened first resin sheet 2a to component 3 is higher than the adhesive strength of adhesive face 31u of pressure sensitive adhesive sheet 31 to component 3, component 3 is allowed to remain on the surface of first resin sheet 2a even in the case where pressure sensitive adhesive sheet 31 is peeled off After that, steps S2 and S3 are performed. Since the details of steps S2 and S3 are the same as those having been described in the first and second embodiments, description thereof will not be repeated.

In the present embodiment, when a component is fixed to the first resin sheet in step S1, the component is temporarily fixed to the pressure sensitive adhesive sheet before the component is transferred onto the first resin sheet. The resin can be heated and softened in order to fix the component to the first resin sheet. If separate components are to be directly handled and fixed to the first resin sheet, an operation can be performed of positioning and arranging each component at such a high temperature that allows softening of the resin or an operation can be performed of heating the first resin sheet after all of the components are arranged. In the former case, the operation of arranging the components is performed at an elevated temperature, so that it becomes hard to perform the operation. In the latter case, since the component is merely placed on the surface of the first resin sheet before the first resin sheet is softened, the component may be displaced from its original position due to vibrations, impacts, and the like.

On the other hand, the pressure sensitive adhesive sheet allows temporary fixing of the component without having to raise a temperature. Therefore, the operation of temporarily fixing the component to the pressure sensitive adhesive sheet can be readily carried out. Then, the pressure sensitive adhesive sheet having the component temporarily fixed thereto is stacked on the first resin sheet, which is then heated so that the resin of the first resin sheet can be softened. Since the component is temporarily fixed by the pressure sensitive adhesive sheet, the component can be prevented also from being displaced during heating.

A pin hole may be provided at an appropriate position of the pressure sensitive adhesive sheet, for example, in the vicinity of the outer circumference, and then, the pressure sensitive adhesive sheet may be positioned by a die pin. If a pin hole having the same standard is provided also in the first resin sheet, the operation for stacking can be efficiently performed, and accurate positioning can be promptly performed.

(Fourth Embodiment)

Figure 21:
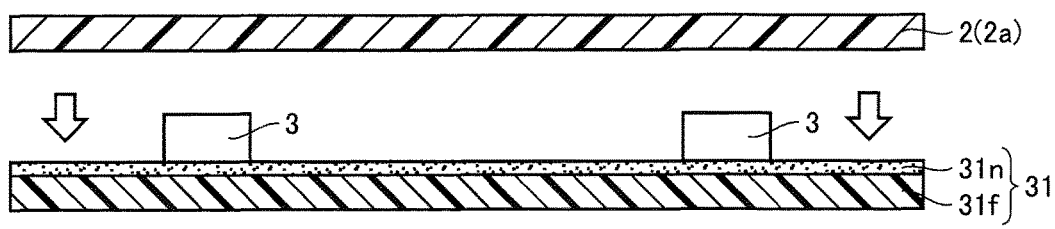
FIG. 21 is a first explanatory diagram of a problem occurring when there is a region where the distance between components is relatively long.
Figure 22:
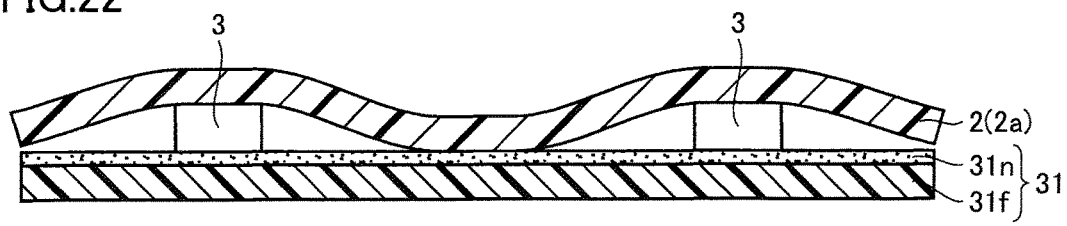
FIG. 22 is a second explanatory diagram of the problem occurring when there is a region where the distance between components is relatively long.

In the case where there is a region where the distance between components 3 is relatively long (as shown in FIG. 21), first resin sheet 2a may be flexed and brought into contact with pressure sensitive adhesive sheet 31 (as shown in FIG. 22) when component 3 is to be transferred from pressure sensitive adhesive sheet 31 onto first resin sheet 2a. In the case where a part of first resin sheet 2a is brought into contact with pressure sensitive adhesive sheet 31 in this way, first resin sheet 2a and pressure sensitive adhesive sheet 31 adhere to each other, so that handling becomes difficult. Furthermore, even in the case where component 3 is accurately positioned on pressure sensitive adhesive sheet 31, component 3 may be transferred at an inaccurate position on the surface of first resin sheet 2a if first resin sheet 2a is flexed when component 3 is transferred from pressure sensitive adhesive sheet 31 onto first resin sheet 2a. A fourth embodiment according to the present disclosure provides a method which may overcome such a problem.

Referring to FIGS. 23 to 28, a method of manufacturing a resin multilayer substrate in the fourth embodiment according to the present disclosure will be hereinafter described.

The method of manufacturing a resin multilayer substrate in the present embodiment is basically the same as that of the third embodiment, but is different in the following points.

Before step S12 of stacking, the method of manufacturing a resin multilayer substrate in the present embodiment includes the step of arranging a protection sheet so as to cover at least a part of the adhesive face other than a region of the adhesive face where the component is disposed. Step S12 of stacking is performed such that the protection sheet is sandwiched between the pressure sensitive adhesive sheet and the first resin sheet.

Figure 23:
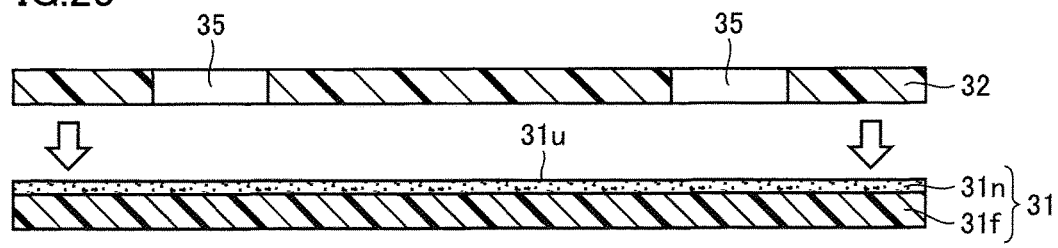
FIG. 23 is a first explanatory diagram of a method of manufacturing a resin multilayer substrate in a fourth embodiment according to the present disclosure.
Figure 24:
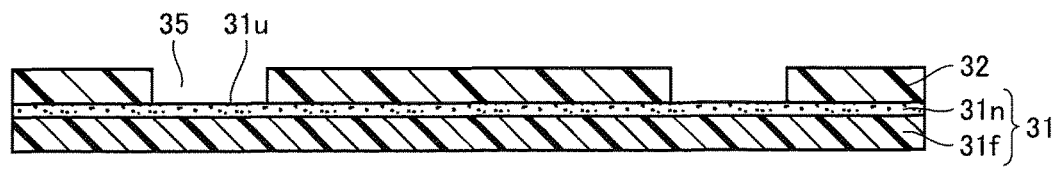
FIG. 24 is a second explanatory diagram of the method of manufacturing a resin multilayer substrate in the fourth embodiment according to the present disclosure.
Figure 25:
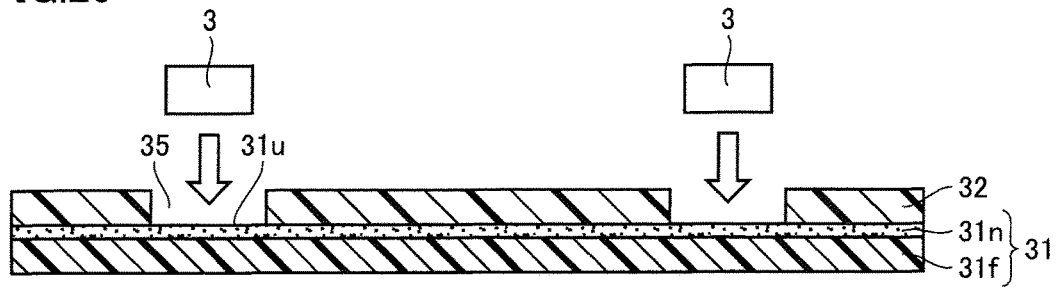
FIG. 25 is a third explanatory diagram of the method of manufacturing a resin multilayer substrate in the fourth embodiment according to the present disclosure.
Figure 26:
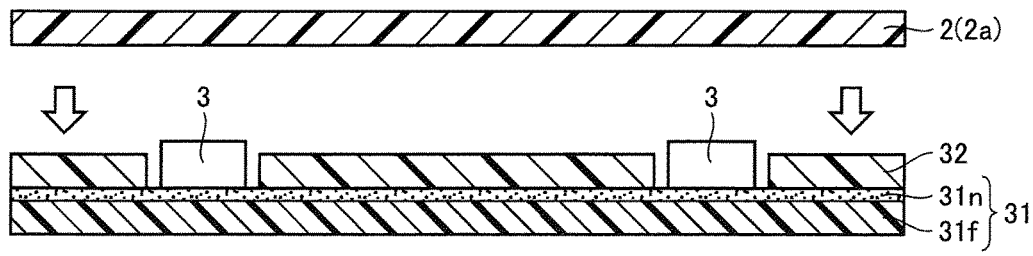
FIG. 26 is a fourth explanatory diagram of the method of manufacturing a resin multilayer substrate in the fourth embodiment according to the present disclosure.

The following is a more specific explanation. First, a protection sheet 32 is prepared, which is provided with an opening 35 in advance in a region corresponding to component 3. Then, as shown in FIG. 23, protection sheet 32 is affixed onto adhesive face 31u of pressure sensitive adhesive sheet 31 so as to cover at least a part of adhesive face 31u other than a region of adhesive faces 31u where component 3 is disposed. Protection sheet 32 is a sheet with no adhesiveness or a sheet that is lower in adhesiveness than the pressure sensitive adhesive sheet. Protection sheet 32 can be a PET film, for example. Protection sheet 32 is provided with opening 35 in advance. The size of opening 35 is slightly larger than the size of component 3 as seen in plan view. Protection sheet 32 is affixed onto adhesive face 31u of pressure sensitive adhesive sheet 31, which results in the state as shown in FIG. 24. Then, in step S11, component 3 is temporarily fixed to adhesive face 31u as shown in FIG. 25. The region of adhesive face 31u that is exposed through opening 35 is slightly larger than the size of component 3. Then, in step S12, first resin sheet 2a is stacked as shown in FIG. 26. In this case, protection sheet 32 is to be sandwiched between pressure sensitive adhesive sheet 31 and first resin sheet 1a.

Figure 27:
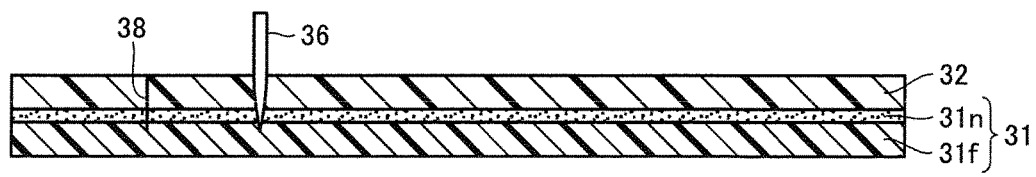
FIG. 27 is a fifth explanatory diagram of the method of manufacturing a resin multilayer substrate in the fourth embodiment according to the present disclosure.
Figure 28:
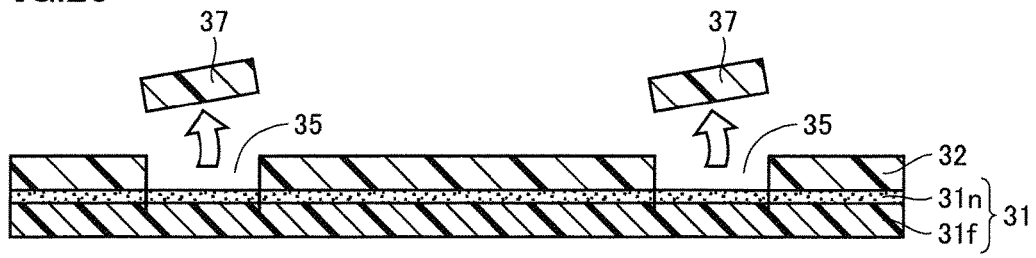
FIG. 28 is a sixth explanatory diagram of the method of manufacturing a resin multilayer substrate in the fourth embodiment according to the present disclosure.

Other methods are also conceivable for arranging protection sheet 32 as shown in FIG. 24. For example, as shown in FIG. 27, protection sheet 32 may be affixed so as to cover the entire adhesive face 31u of pressure sensitive adhesive sheet 31, and then, a cut 38 may be made using a blade 36 to such a depth that allows protection sheet 32 to be cut, so as to extend along the outline of the region corresponding to component 3. In this case, cut 38 is made so as to surround a region corresponding to component 3. An unnecessary portion 37 of protection sheet 32 is peeled and removed as shown in FIG. 28. The structure shown in FIG. 24 can be obtained also in this way. Then, component 3 is temporarily fixed to adhesive face 31u in the same manner as shown in FIG. 25.

Other steps are the same as those having been described in the previous embodiments.

According to the method of manufacturing a resin multilayer substrate in the present embodiment, protection sheet 32 is sandwiched between pressure sensitive adhesive sheet 31 and first resin sheet 1a in the state where at least a part of the adhesive face is covered using a protection sheet. Accordingly, it becomes possible to avoid such a situation that first resin sheet 2a and pressure sensitive adhesive sheet 31 adhere to each other when performing the step of stacking first resin sheet 2a.

In addition, it is preferable that the thickness of protection sheet 32 is 50% or more and 80% or less of the thickness of component 3. The thickness of protection sheet 32 is preferably less than the thickness of component 3 so that component 3 protrudes through opening 35. In such a case, first resin sheet 2a and pressure sensitive adhesive sheet 31 are pressed, thereby allowing the action of pressing force to be concentrated on component 3, so that component 3 can be more reliably fixed to first resin sheet 2a. This effect is decreased if the thickness of protection sheet 32 is close to the thickness of component 3. It is thus preferable that the thickness of protection sheet 32 is 80% or less of the thickness of component 3 since the above-described effect can be sufficiently achieved. However, if the thickness of protection sheet 32 is too thin, first resin sheet 2a can be flexed even though first resin sheet 2a can be prevented from adhering to pressure sensitive adhesive sheet 31. This increases the possibility that component 3 will be transferred at an inaccurate position on the surface of first resin sheet 2a. Therefore, it is preferable that the thickness of protection sheet 32 is 50% or more and 80% or less of the thickness of component 3.

In addition, although being applicable to each of the above-described embodiments, it is preferable that step S1 of fixing component 3 to first resin sheet 2a is performed at a temperature lower than that in step S3 of compression bonding. By making a difference between temperatures in this way, in step S1, component 3 can be temporarily compression bonded to first resin sheet 2a in a more simple state as compared with main compression bonding in step S3. Furthermore, undesirable deformation of first resin sheet 2a due to heat is suppressed.

A "component" as used in the present disclosure can be an element including all of passive components such as an IC chip as well as a chip capacitor, a chip inductor, and a chip resistor; substrate members such as a substrate made of ferrite or low temperature sintering ceramic, and a printed wiring board; or functional members such as a metal plate including an SUS plate, a copper plate and the like.

(Fifth Embodiment)

Figure 29:
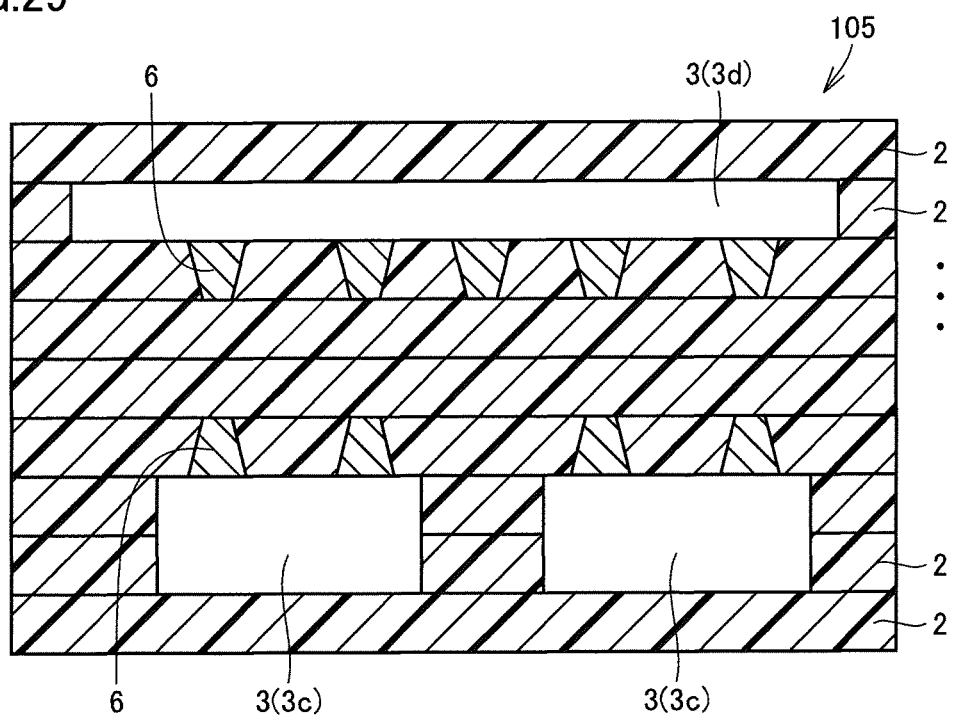
FIG. 29 is a cross-sectional view of a resin multilayer substrate in which components are incorporated at a plurality of different height positions.

As shown in FIG. 29, hereinafter described will be the case where components 3 are incorporated at a plurality of different height positions within one resin multilayer substrate 105. Resin multilayer substrate 105 shown in FIG. 29 incorporates components 3c and 3d at two height positions.

Before starting the explanation of a fifth embodiment according to the present disclosure, a manufacturing method for obtaining such a resin multilayer substrate 105 by assembling layers sequentially from the lower layer will be described with reference to FIGS. 30 to 34.

Figure 30:
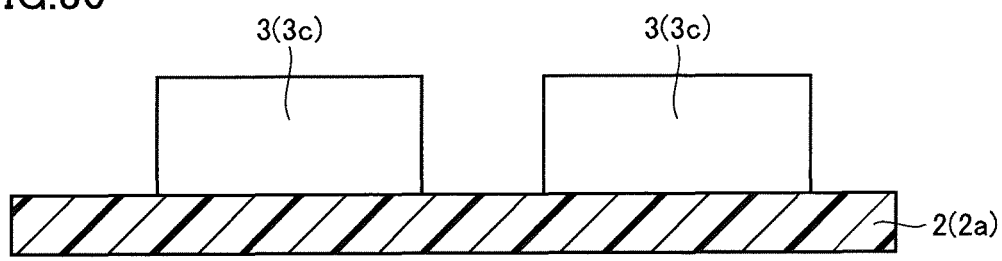
FIG. 30 is a first explanatory diagram of a manufacturing method for obtaining a resin multilayer substrate in which components are incorporated at a plurality of different height positions, by assembling layers sequentially from the lower layer.
Figure 31:
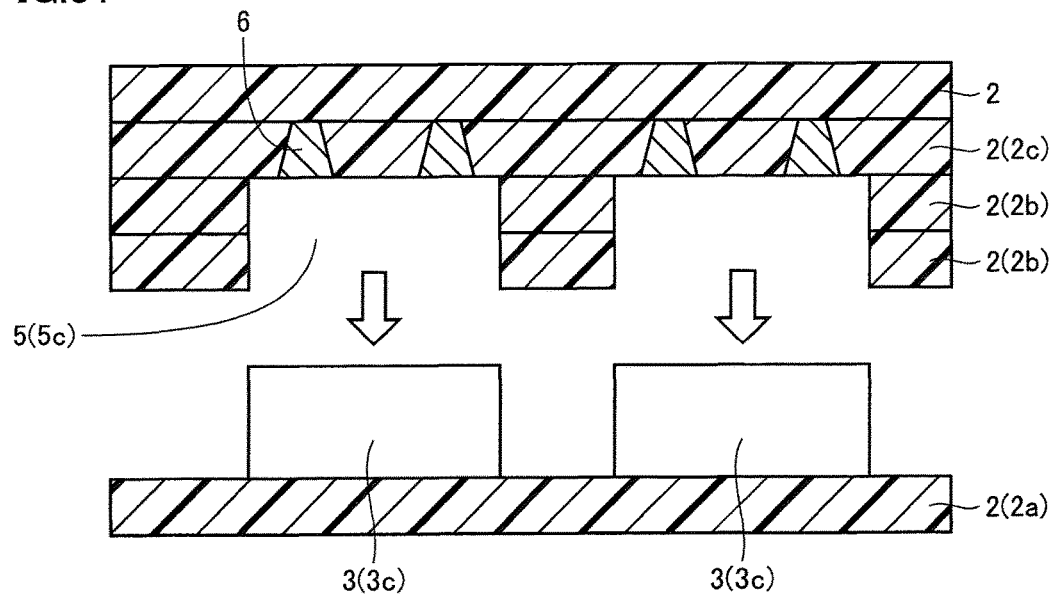
FIG. 31 is a second explanatory diagram of the manufacturing method for obtaining a resin multilayer substrate in which components are incorporated at a plurality of different height positions, by assembling layers sequentially from the lower layer.
Figure 32:
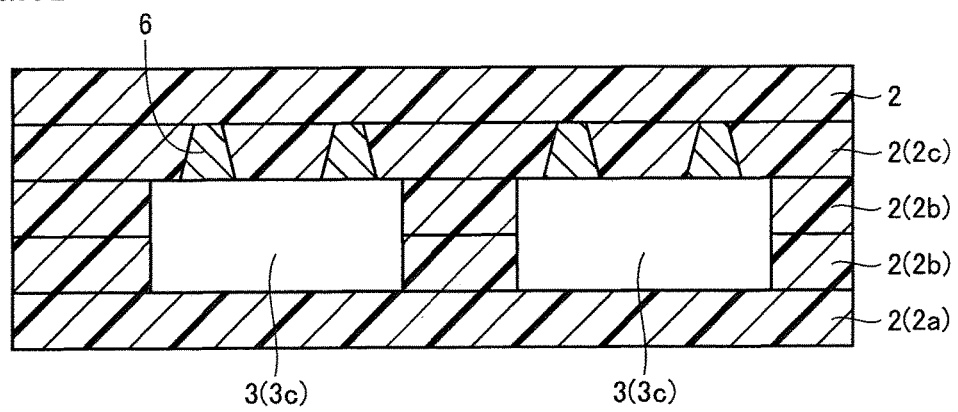
FIG. 32 is a third explanatory diagram of the manufacturing method for obtaining a resin multilayer substrate in which components are incorporated at a plurality of different height positions, by assembling layers sequentially from the lower layer.

First, in step S1, as shown in FIG. 30, a component 3c is placed on the upper surface of first resin sheet 2a and then compression bonded. The first heating is performed at this time. Then, as shown in FIG. 31, a stacked body including a second resin sheet 2b and a third resin sheet 2c and provided with a cavity 5c is separately fabricated in advance, and then, overlaid on the structure body shown in FIG. 30 from above, as step S2. The structure shown in FIG. 32 is obtained in this way. The second heating is performed as step S3 in order to obtain the integrated structure shown in FIG. 32 in this stage.

Figure 33:
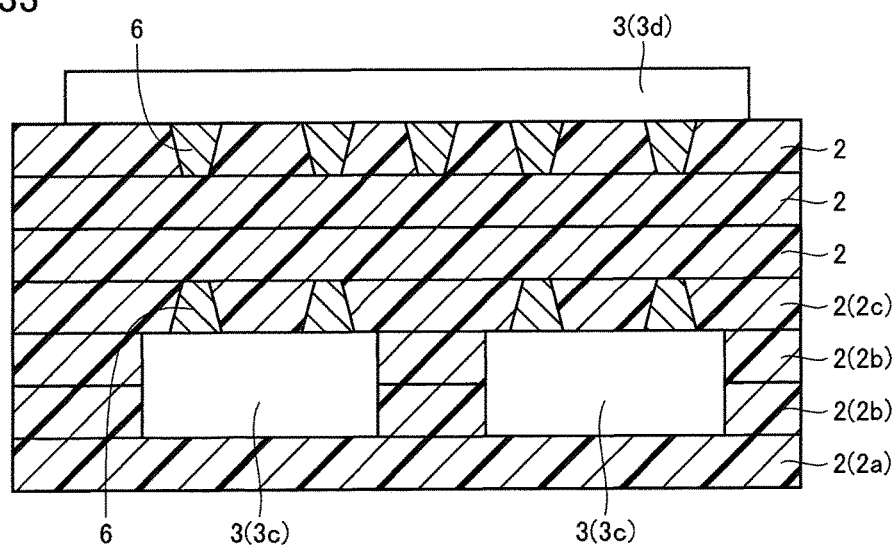
FIG. 33 is a fourth explanatory diagram of the manufacturing method for obtaining a resin multilayer substrate in which components are incorporated at a plurality of different height positions, by assembling layers sequentially from the lower layer.
Figure 34:
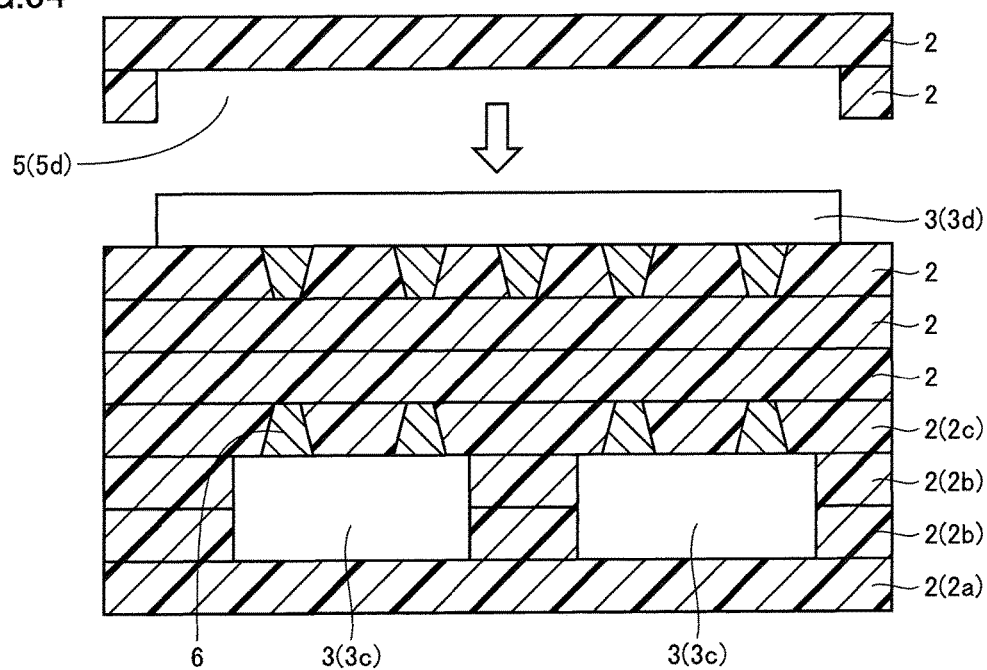
FIG. 34 is a fifth explanatory diagram of the manufacturing method for obtaining a resin multilayer substrate in which components are incorporated at a plurality of different height positions, by assembling layers sequentially from the lower layer.

Furthermore, as shown in FIG. 33, a resin sheet 2 is stacked on the upper surface, on which a component 3d is placed and then compression bonded. This step corresponds to step S1. The third heating is performed at this time. Furthermore, in step S2, as shown in FIG. 34, a stacked body having a cavity 5d is separately fabricated by stacking desired resin sheets 2, and then overlaid from above. In this way, the structure shown in FIG. 29 is obtained. Then, the entire structure is integrated by thermocompression bonding as step S3. The fourth heating is performed at this time.

Figure 35:
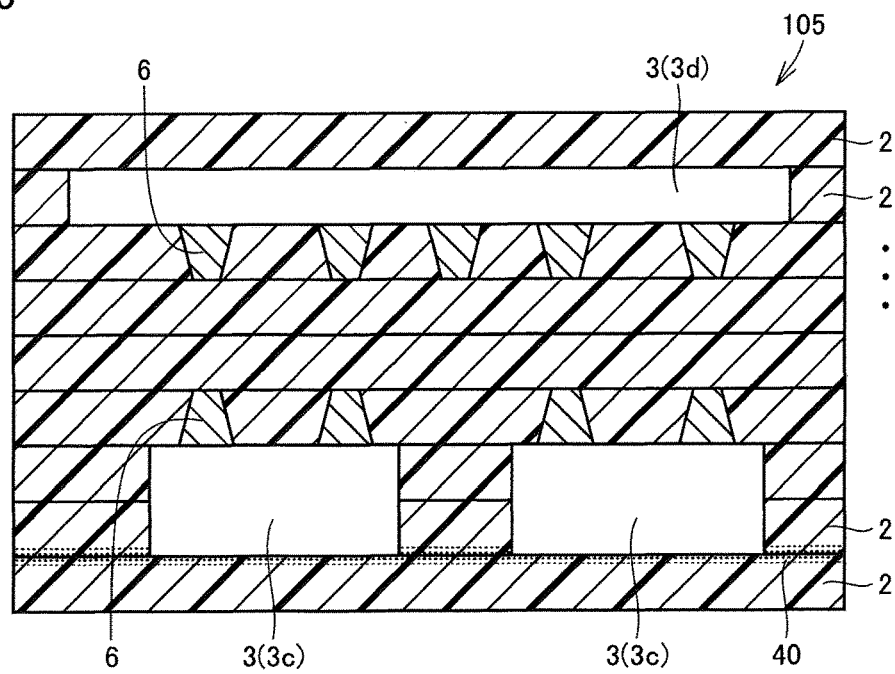
FIG. 35 is an explanatory diagram of an example in which a maximum value of the number of times of heating the same part in the obtained resin multilayer substrate is relatively large.

Resin multilayer substrate 105 shown in FIG. 29 can be obtained through the fourth heating. It is to be noted that the number of heating times varies depending on parts in this resin multilayer substrate 105. In other words, the heat history varies depending on parts. Particularly, at an interface 40 shown in FIG. 35, all of the first heating to the fourth heating are conducted. Accordingly, the greatest number of times of heating is conducted at this interface 40 in the entire resin multilayer substrate 105. In resin multilayer substrate 105 obtained as described above, the maximum value of the number of times of heating the same part is four. Generally, a portion in the resin multilayer substrate that has been heated many times is changed in material physical properties or produces residual stress, so that peeling is more likely to occur. Therefore, it is preferable that the resin multilayer substrate does not include a portion having been heated many times in this way.

Based on the idea as described above, it can be said that the following method is preferable when fabricating a resin multilayer substrate incorporating components at a plurality of different height positions. Specifically, the entire resin multilayer substrate is fabricated from stacked bodies divided for some parts. It is to be noted that the resin multilayer substrate is divided such that a stacked body of each part incorporates a component. In this way, stacked bodies are separately compression bonded in the state where each stacked body incorporate a component. These stacked bodies are later combined and compression bonded, with the result that one resin multilayer substrate can be obtained. In this way, the maximum value of the number of times of heating the same part in a resin multilayer substrate can be decreased.

Similarly to the above, based on the premise of an example of fabricating resin multilayer substrate 105 shown in FIG. 29, a method of manufacturing a resin multilayer substrate in the fifth embodiment according to the present disclosure will be hereinafter specifically described with reference to FIGS. 30 to 32 and FIGS. 36 to 39.

As shown in FIGS. 30 to 32, step S1 to step S3 are performed to fabricate a partial stacked body as shown in FIG. 32 in advance, which is the same as described above. The stacked body obtained in this way will be hereinafter referred to as a "lower stacked body". The number of times of heating is two in a part of the lower stacked body that has been subjected to the maximum number of times of heating.

Figure 36:
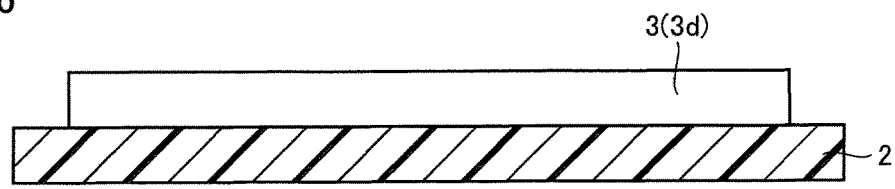
FIG. 36 is a first explanatory diagram of a method of manufacturing a resin multilayer substrate in a fifth embodiment according to the present disclosure.
Figure 37:
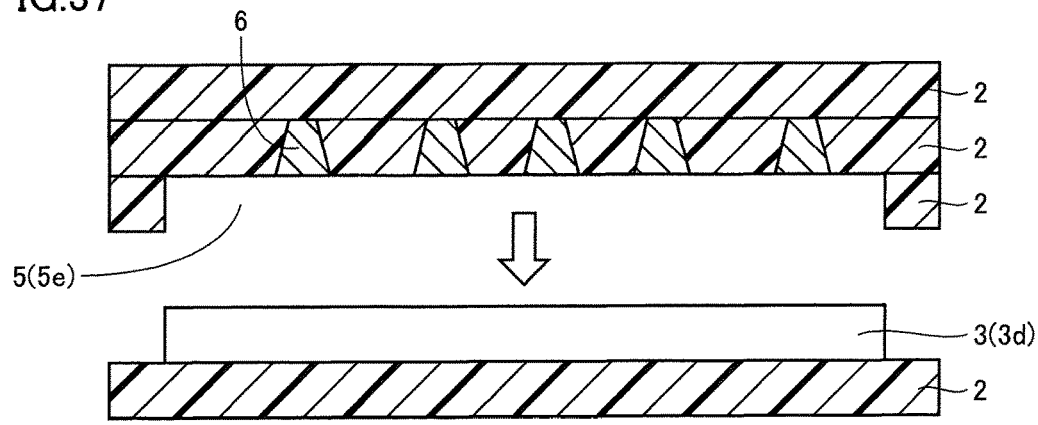
FIG. 37 is a second explanatory diagram of the method of manufacturing a resin multilayer substrate in the fifth embodiment according to the present disclosure.
Figure 38:
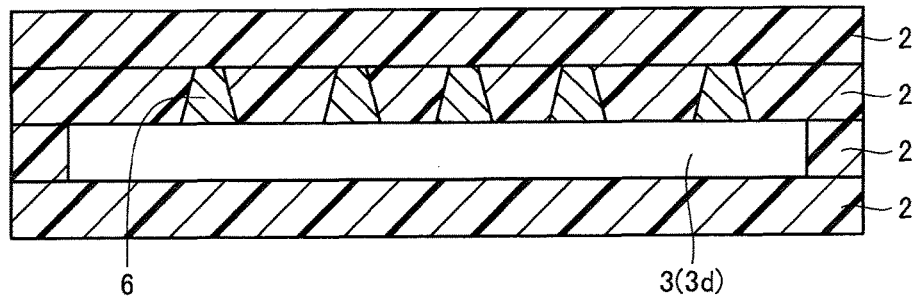
FIG. 38 is a third explanatory diagram of the method of manufacturing a resin multilayer substrate in the fifth embodiment according to the present disclosure.

Separately from the lower stacked body, component 3d is placed on the upper surface of resin sheet 2 and then compression bonded as shown in FIG. 36. This step corresponds to step S1. Heating performed during this compression bonding is the first heating for the structure body shown in FIG. 36. As shown in FIG. 37, a plurality of resin sheets 2 are combined to separately fabricate a stacked body having a cavity 5e. Then, in step S2, this stacked body is overlaid from above on the structure body shown in FIG. 36. This results in a structure shown in FIG. 38. In order to achieve an integrated structure shown in FIG. 38 in this stage, the second heating is performed as step S3. The stacked body obtained in this way will be hereinafter referred to as an "upper stacked body".

Figure 39:
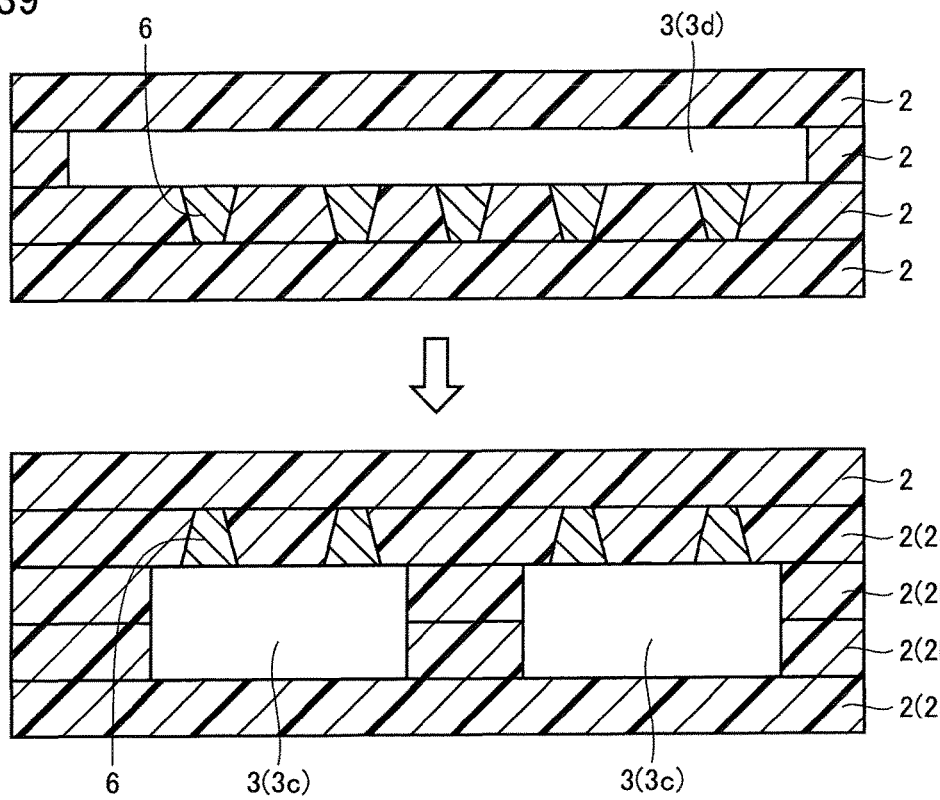
FIG. 39 is a fourth explanatory diagram of the method of manufacturing a resin multilayer substrate in the fifth embodiment according to the present disclosure.

As shown in FIG. 39, the upper stacked body is overlaid on the lower stacked body. In the example shown in this case, the upper stacked body is reversed upside down as compared with the state shown in FIG. 38. The lower stacked body and the upper stacked body are heated so as to be integrated by thermocompression bonding. This heating is the third heating for each of the lower stacked body and the upper stacked body. Thus, a resin multilayer substrate 105 shown in FIG. 29 is obtained. The maximum value of the number of times of heating the same part in resin multilayer substrate 105 is three. As compared with the previously described example in which the maximum value is four, the maximum value of the number of times of heating the same part can be reduced by one.

The following is a summary of the results clarified in the above. In the case where a resin multilayer substrate incorporating components at a plurality of different height positions is fabricated, a plurality of partial stacked bodies each formed of resin sheets each separately incorporating a component are fabricated, and then, stacked in a multiple stages, and further entirely heated and compression bonded again. Thereby, a partially excessive thermal history can be avoided, so that changes in material physical properties and peeling due to residual stress can be less likely to occur.

(Sixth Embodiment)

Figure 40:
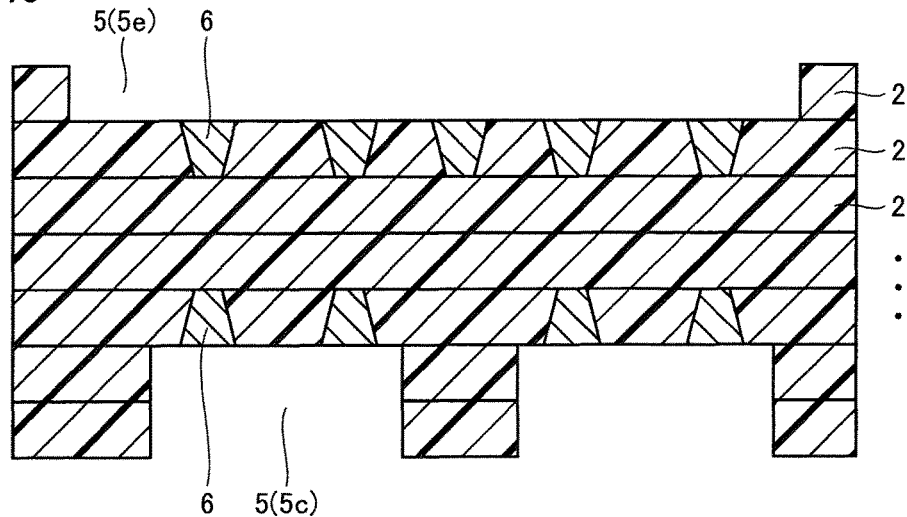
FIG. 40 is a first explanatory diagram of a method of manufacturing a resin multilayer substrate in a sixth embodiment according to the present disclosure.
Figure 41:
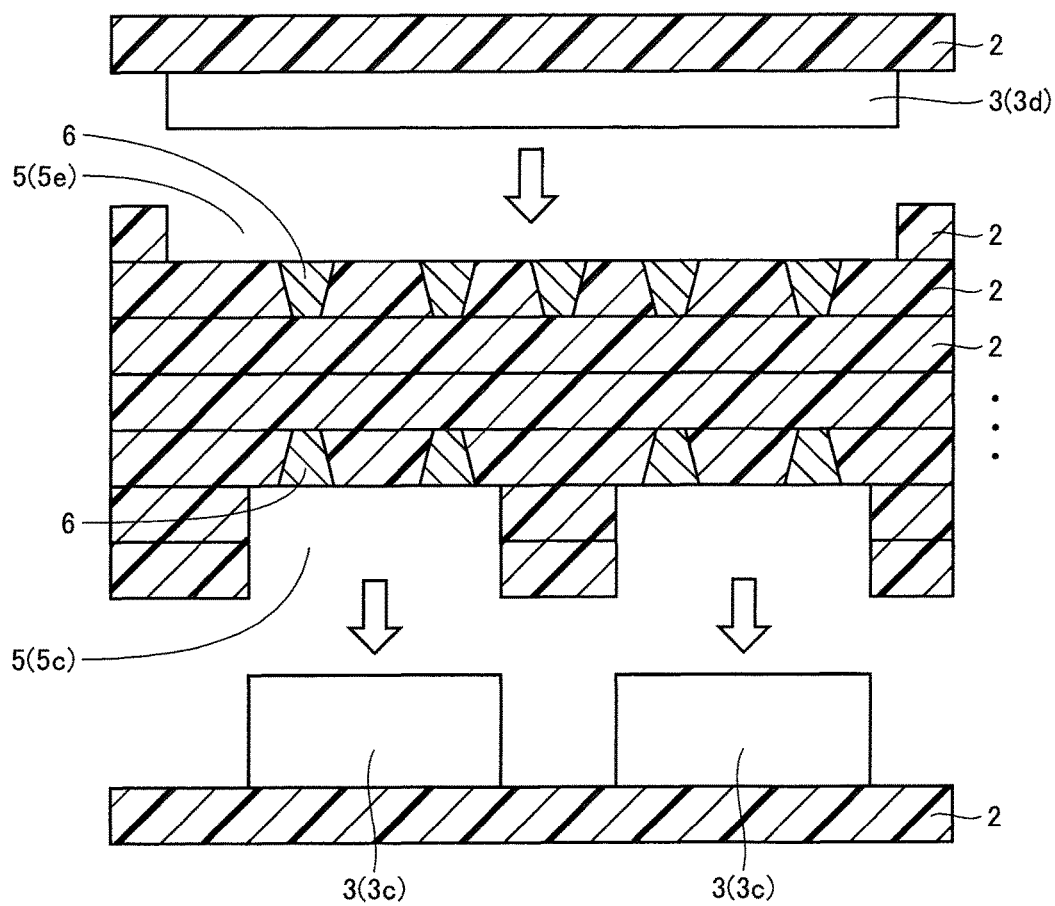
FIG. 41 is a second explanatory diagram of the method of manufacturing a resin multilayer substrate in the sixth embodiment according to the present disclosure.

A further modification of the manufacturing method having been described in the fifth embodiment will be hereinafter described as a sixth embodiment according to the present disclosure. The fifth embodiment provides an example in which mainly two stacked bodies including a lower stacked body and an upper stacked body are separately fabricated, combined with each other, and then, compression bonded. In the sixth embodiment, a structure body in which a component 3c is compression bonded to one surface of resin sheet 2 as shown in FIG. 30 and a structure body in which a component 3d is compression bonded to one surface of resin sheet 2 as shown in FIG. 36 are separately fabricated. Separately from these structure bodies, a stack of resin sheets combined as appropriate as shown in FIG. 40 is fabricated. The structure body shown in FIG. 40 will be hereinafter referred to as an "intermediate stacked body". In the example shown in FIG. 40, the intermediate stacked body has a cavity 5c on its lower surface and a cavity 5e on its upper surface. The intermediate stacked body is provided therein with a via conductor 6. The number of times of heating for each of the structure body shown in FIG. 30, the structure body shown in FIG. 36, and the intermediate stacked body shown in FIG. 40 is still one. Then, as shown in FIG. 41, the intermediate stacked body shown in FIG. 40 is overlaid on the structure body shown in FIG. 30, on which the structure body shown in FIG. 36 that is reversed upside down is further overlaid. In this way, the entire structure is integrated by thermocompression bonding in step S3. Heating performed at this time is the second heating for each of three components shown in FIG. 41. In this way, resin multilayer substrate 105 shown in FIG. 29 is obtained. The maximum value of the number of times of heating the same part in resin multilayer substrate 105 is two. As compared with the fifth embodiment in which the maximum value is four or three, the maximum value of the number of times of heating the same part can be further reduced in the present embodiment.

By fabricating each part in advance in this way, the maximum value of the number of times of heating can be reduced as appropriate, so that peeling occurring in the resin multilayer substrate can be suppressed.

Figure 42:
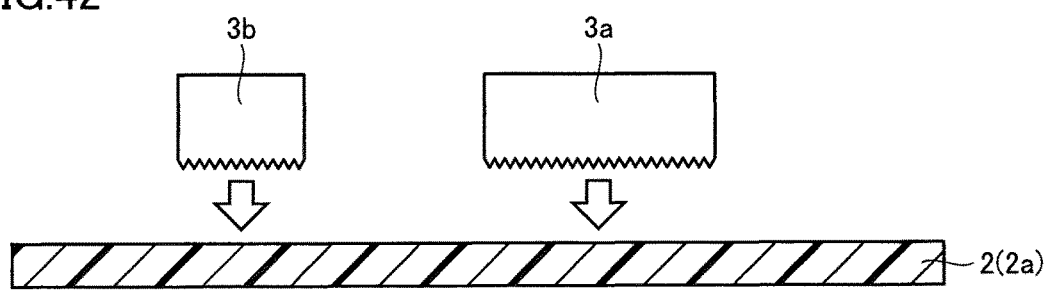
FIG. 42 is a first explanatory diagram showing a case where a component having a roughened surface is used.
Figure 43:
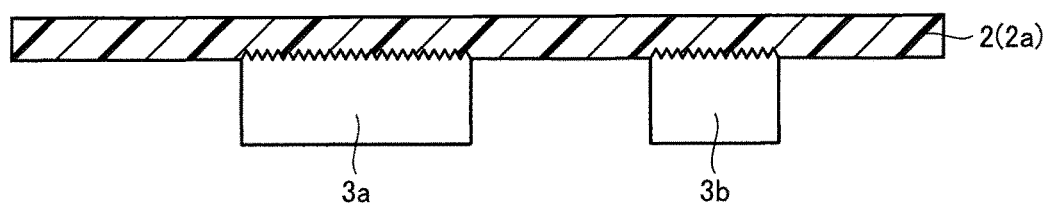
FIG. 43 is a second explanatory diagram showing a case where a component having a roughened surface is used.

In addition, although being applicable also to each of the above-described embodiments, it is preferable that the surface of component 3 on the first side has been subjected to a roughening treatment, for example, as shown in FIG. 42, at the point of time when starting step S1 of fixing component 3 to first resin sheet 2a. "The surface . . . on the first side" means the surface on the side that is in contact with first resin sheet 2a, as having been described in the first embodiment. In FIGS. 42 and 43, in order to show that one of the surfaces of component 3 on the side that comes into contact with first resin sheet 2a is coarse, this surface is exaggeratedly shown as having projections and depressions. By employing this configuration, the roughening-treated surface of component 3 exerts an anchor effect on the softened resin surface of first resin sheet 2a, thereby allowing further firmer fixation. Therefore, as shown in FIG. 43, component 3 can be more reliably fixed to first resin sheet 2a. The "roughening treatment" means the treatment for increasing the surface roughness and can be carried out as appropriate by the known techniques.

The component incorporated in a resin multilayer substrate is not limited to an IC (Integrated Circuit) that has an external electrode on its bottom surface. The component incorporated in a resin multilayer substrate can be, for example, a ceramic chip component having an external electrode on its side surface.

In the method of manufacturing a resin multilayer substrate according to the present disclosure, a component is fixed generally by a surface when performing step S1 as shown in FIGS. 2 and 3, that is, a so-called surface mounting is performed. In the examples shown in FIGS. 2 and 3, component 3 is actually fixed at its lower surface to resin sheet 2.

Figure 44:
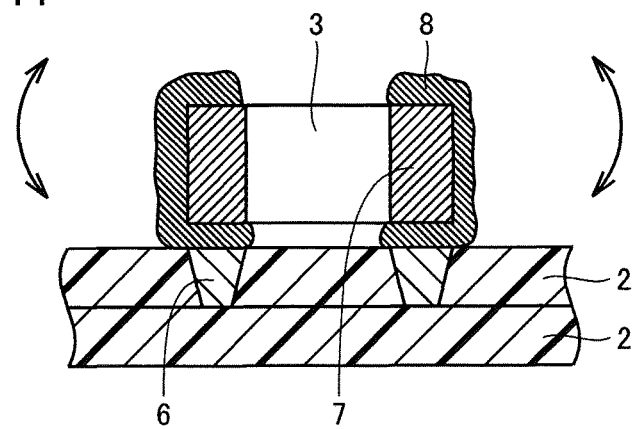
FIG. 44 is an explanatory diagram showing a state where a component having a plated external electrode is mounted on the surface of a resin sheet.

However, a small-sized ceramic chip component is often structured on the assumption that this component would be mounted by solder applied onto its side surface. This type of component has an external electrode whose shape is not so flat as compared with a component assumed to be surface mounted. This is because, in addition to the fact that the external electrode is formed using a dipping method or the like, Ni plating and Au plating are originally applied for covering the part in which glass precipitates, for the purpose of allowing easy solder joining For example, as shown in FIG. 44, in the case where component 3 includes external electrode 7 formed by the dipping method and this external electrode 7 has a plated layer 8, the flatness deteriorates due to existence of external electrode 7, and further, the thickness of plated layer 8 also contributes to flatness deterioration. In the case where such component 3 is mounted on the surface of resin sheet 2, the position of component 3 tends to be not fixed and to become inaccurate as shown by a curved arrow in FIG. 44.

Figure 45:
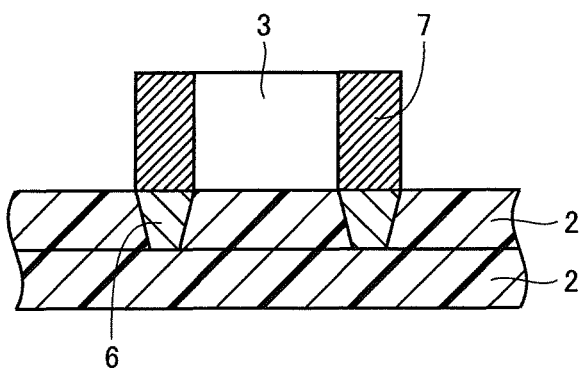
FIG. 45 is an explanatory diagram showing the state where a component having an external electrode that is not plated is mounted on the surface of a resin sheet.

Accordingly, in consideration of the stability at the time when a component is fixed to the surface of the resin sheet, it is preferable to employ a component having an upper surface and a lower surface with high flatness as a component used in the method of manufacturing a resin multilayer substrate according to the present disclosure. Therefore, it is preferable to use component 3 including external electrode 7 having been not plated, for example, as shown in FIG. 45.

The above-described embodiments disclosed herein are illustrative and non-restrictive in every respect. The scope of the present invention is defined by the terms of the claims, rather than the description above, and is intended to include any modifications within the meaning and scope equivalent to the terms of the claims.

INDUSTRIAL APPLICABILITY

The present disclosure is applicable to a method of manufacturing a resin multilayer substrate in which a component is incorporated.

REFERENCE SIGNS LIST 2 resin sheet, 2a first resin sheet, 2b second resin sheet, 2c third resin sheet, 3, 3a, 3b, 3c, 3d component, 4, 14 through hole, 5, 5a, 5b, 5c, 5d, 5e cavity, 6 via conductor, 7 external electrode, 8 plated layer, 31 pressure sensitive adhesive sheet, 31f resin layer, 31n adhesive layer, 31u adhesive face, 32 protection sheet, 35 opening, 36 blade, 37 unnecessary portion, 38 cut, 40 interface, 101, 102, 103, 104, 105 resin multilayer substrate.

The invention claimed is:

1. A method of manufacturing a resin multilayer substrate in which a component is incorporated in a stacked body obtained by stacking a plurality of thermoplastic resin sheets, said method comprising the steps of:
fixing said component to a first resin sheet of said plurality of resin sheets by pressing said component against said first resin sheet in a state where said first resin sheet is softened by heating, said first resin sheet being located adjacent to a first side in a thickness direction of said component;
stacking said first resin sheet having said component fixed thereto on a second resin sheet of said plurality of resin sheets that has a through hole receiving said component and a third resin sheet of said plurality of resin sheets that is located adjacent to a second side of said component opposite to said first side, such that said component is inserted into said through hole and a surface of said component on said second side faces said third resin sheet; and
performing compression bonding by heating and pressurizing said stacked body including said first resin sheet, said second resin sheet and said third resin sheet.

2. The method of manufacturing a resin multilayer substrate according to claim 1, wherein
said step of fixing said component to said first resin sheet includes the steps of:
temporarily fixing said component to a pressure sensitive adhesive sheet by arranging said component on an adhesive face provided on a surface of the pressure sensitive adhesive sheet;
stacking said pressure sensitive adhesive sheet, which has said component temporarily fixed thereto, on said first resin sheet in such a manner that said component is in contact with said first resin sheet;

softening said first resin sheet by heating, and pressing said pressure sensitive adhesive sheet against said first resin sheet; and peeling said pressure sensitive adhesive sheet while causing said component to remain on a surface of said first resin sheet.

3. The method of manufacturing a resin multilayer substrate according to claim 2, further comprising, before said step of stacking said pressure sensitive adhesive sheet, the step of:

arranging a protection sheet so as to cover at least a part of said adhesive face other than a region of said adhesive face on which said component is disposed, wherein said step of stacking said pressure sensitive adhesive sheet is performed so as to sandwich said protection sheet between said pressure sensitive adhesive sheet and said first resin sheet.

4. The method of manufacturing a resin multilayer substrate according to claim 3, wherein said protection sheet has a thickness of 50% or more and 80% or less of a thickness of said component.

5. The method of manufacturing a resin multilayer substrate according to claim 1, wherein said step of fixing said component to said first resin sheet is performed at a temperature lower than a temperature in said step of compression bonding.

6. The method of manufacturing a resin multilayer substrate according to claim 1, wherein a surface of said component on said first side has been roughened at a time of starting said step of fixing said component to said first resin sheet.

7. The method of manufacturing a resin multilayer substrate according to claim 1, wherein a conductor is disposed within the third resin sheet to establish an electrical connection to said component.

8. The method of manufacturing a resin multilayer substrate according to claim 2, wherein after the step of softening and pressing and prior to the step of peeling, an adhesive strength of the softened first resin sheet to said component is higher than an adhesive strength of the adhesive face of the pressure sensitive adhesive sheet to said component.

9. The method of manufacturing a resin multilayer substrate according to claim 3, wherein the protection sheet has no adhesiveness or an adhesive strength to said component that is less than an adhesive strength of the adhesive face of the pressure sensitive adhesive sheet to said component.

10. The method of manufacturing a resin multilayer substrate according to claim 3, wherein the protection sheet is provided with an opening corresponding to said component.

* * * * *